United States Patent
Umeda et al.

(10) Patent No.: US 10,720,102 B2
(45) Date of Patent: Jul. 21, 2020

(54) DRIVING METHOD FOR DISPLAY DEVICE

(71) Applicant: Japan Display Inc., Tokyo (JP)

(72) Inventors: Yutaka Umeda, Tokyo (JP); Hiroyuki Kimura, Tokyo (JP); Makoto Shibusawa, Tokyo (JP); Tetsuo Morita, Tokyo (JP)

(73) Assignee: Japan Display Inc., Tokyo (JP)

( * ) Notice: Subject to any disclaimer, the term of this patent is extended or adjusted under 35 U.S.C. 154(b) by 0 days.

(21) Appl. No.: 16/248,077

(22) Filed: Jan. 15, 2019

(65) Prior Publication Data

US 2019/0228706 A1    Jul. 25, 2019

(30) Foreign Application Priority Data

Jan. 24, 2018    (JP) .................... 2018-009748

(51) Int. Cl.
*G09G 3/3233*    (2016.01)
*G09G 3/3258*    (2016.01)
*G09G 3/3266*    (2016.01)
*H01L 27/32*    (2006.01)

(52) U.S. Cl.
CPC ......... *G09G 3/3233* (2013.01); *G09G 3/3258* (2013.01); *G09G 3/3266* (2013.01); *H01L 27/3276* (2013.01); *G09G 2300/0426* (2013.01); *G09G 2300/0439* (2013.01); *G09G 2310/08* (2013.01); *H01L 27/3265* (2013.01)

(58) Field of Classification Search
CPC ......... G09G 2300/0426; G09G 3/3266; G09G 3/3233; G09G 3/3258; G09G 2300/0819; G09G 2300/0814; G09G 2300/0439; G09G 2310/08; H01L 27/3265; H01L 27/3276
See application file for complete search history.

(56) References Cited

U.S. PATENT DOCUMENTS

| | | | |
|---|---|---|---|
| 2008/0088543 A1* | 4/2008 | Shibusawa | G09G 3/325 345/76 |
| 2008/0309531 A1* | 12/2008 | Choi | G09G 3/3291 341/136 |
| 2012/0001893 A1 | 1/2012 | Jeong et al. | |

FOREIGN PATENT DOCUMENTS

JP    5612988 B2    10/2014

* cited by examiner

*Primary Examiner* — Stacy Khoo
(74) *Attorney, Agent, or Firm* — Michael Best & Friedrich LLP

(57) ABSTRACT

A display device includes a drive transistor having a first electrode connected to a first node, a second electrode connected to a second node, and a third electrode connected to a third node, a first switch having one terminal connected to the first node, a second switch having one terminal connected to the first node, a third switch controlled by a first control signal and having one terminal connected to the second node, a fourth switch controlled by the first control signal together with the third switch, and having one terminal connected to a power supply line and another terminal connected to the third node, a capacitor element having one terminal connected to the first node and another terminal connected to the second node, and a light emitting element including a pixel electrode connected to the second node, and a first common electrode.

4 Claims, 25 Drawing Sheets

DRIVING METHOD FOR DISPLAY DEVICE

CROSS REFERENCE TO RELATED APPLICATIONS

This application is based upon and claims the benefit of priority from the prior Japanese Patent Application No. 2018-009748, filed on Jan. 24, 2018, the entire contents of which are incorporated herein by reference.

FIELD

An embodiment of the present invention relates to a display device and a driving method for a display device.

BACKGROUND

An organic electroluminescence (EL) display device (referred to as an EL display device herein) is formed by a plurality of transistors, a capacitor element, and an organic light emitting element (referred to as a light emitting element below) in each of a plurality of pixels formed on a substrate. Each pixel is driven by a signal for controlling a pixel. By controlling driving of the transistor of each pixel by a signal, a current value supplied to the light emitting element can be controlled and the display device can display an image.

For example, a pixel arranged with seven transistors, one capacitor element and a light emitting element, and a display device including this pixel are disclosed in Japanese Patent No. 5612988.

SUMMARY

One embodiment of the present invention is a display device including a drive transistor (drive transistor DRT) having a first electrode connected to a first node (gate electrode), a second electrode connected to a second node (source electrode), and a third electrode connected to a third node (drain electrode), a first switch (selection transistor SST) having one terminal connected to the first node, a second switch (initialization transistor IST) having one terminal connected to the first node, a third switch (reset transistor RST) controlled by a first control signal and having one terminal connected to the second node, a fourth switch (light emitting control transistor BCT) controlled by the first control signal together with the third switch, and having one terminal connected to a power supply line and another terminal connected to the third node, a capacitor element having one terminal connected to the first node and another terminal connected to the second node, and a light emitting element including a pixel electrode connected to the second node, and a first common electrode.

One embodiment of the present invention is a driving method for a display device, the display device including a drive transistor having a first electrode connected to a first node, a second electrode connected to a second node, and a third electrode connected to a third node, a first switch (selection transistor SST) having one terminal connected to the first node, a second switch (initialization transistor IST) having one terminal connected to the first node, a third switch (reset transistor RST) controlled by a first control signal and having one terminal connected to the second node, a fourth switch (light emitting control transistor BCT) controlled by the first control signal together with the third switch (reset transistor RST), and having one terminal connected to a power supply line and another terminal connected to the third node, a capacitor element having one terminal connected to the first node and another terminal connected to the second node, and a light emitting element including a pixel electrode connected to the second node, and a first common electrode, the driving method including steps of applying a first voltage to the first node by setting the first switch (selection transistor SST) to an OFF state and the second switch (initialization transistor IST) to an ON state, setting the fourth switch (light emitting control transistor BCT) to an OFF state while applying the first voltage to the third node by setting the third switch to an ON state by the first control signal, setting the first switch (selection transistor SST) and the second switch (initialization transistor IST) to an OFF state, and setting the fourth switch (light emitting control transistor BCT) to an OFF state while applying a second voltage to the third node by setting the third switch (reset transistor RST) to an ON state by the first control signal.

One embodiment of the present invention is a display device including a drive transistor (drive transistor DRT) having a first electrode (gate electrode) connected to a first node, a third electrode (drain electrode) connected to a second node, and a second electrode (source electrode) connected to a third node, a first switch (selection transistor SST) having one terminal connected to the third node, a second switch (initialization transistor IST) having one terminal connected to the first node, a third switch (reset transistor RST) controlled by a first control signal and having one terminal connected to a fourth node, a fourth switch (light emitting control transistor BCT) controlled by the first control signal together with the third switch, and having one terminal connected to the second node and another terminal connected to the fourth node, a fifth switch (correction transistor TCT) having one terminal connected to the first node and another terminal connected to the second node, a sixth switch (power supply transistor PST) controlled by the first control signal together with the third switch (reset transistor RST) and the fourth switch (light emitting control transistor BCT), and having one terminal connected to a power supply line and another terminal connected to the third node, a capacitor element having one terminal connected to the first node and another terminal connected to the power supply line, and a light emitting element including a pixel electrode connected to the fourth node, and a first common electrode.

One embodiment of the present invention is a driving method for a display device, the display device including a drive transistor having a first electrode connected to a first node, a third electrode connected to a second node, and a second electrode connected to a third node, a first switch (selection transistor SST) having one terminal connected to the third node, a second switch (initialization transistor IST) having one terminal connected to the first node, a third switch (reset transistor RST) controlled by a first control signal and having one terminal connected to a fourth node, a fourth switch (light emitting control transistor BCT) controlled by the first control signal together with the third switch (reset transistor RST), and having one terminal connected to the second node and another terminal connected to the fourth node, a fifth switch (correction transistor TCT) having one terminal connected to the first node and another terminal connected to the second node, a sixth switch (power supply transistor PST) controlled by the first control signal together with the third switch (reset transistor RST) and the fourth switch (light emitting control transistor BCT), and having one terminal connected to a power supply line and another terminal connected to the third node, a capacitor element having one terminal connected to the first node and another terminal connected to the power supply line, and a light emitting element including a pixel electrode connected to the fourth node, and a first common electrode, the driving method including steps of applying a first voltage to the first node by setting the first switch (selection transistor SST) and the fifth switch (correction transistor TCT) to an OFF state and the second switch (initialization transistor IST) to an ON state, setting the fourth switch (light emitting control transistor BCT) and the sixth switch (power supply transistor PST) to an OFF state while applying the first voltage to the fourth node by setting the third switch (reset transistor RST) to an ON state by the first control signal, setting the first switch (selection transistor SST), the fifth switch (correction transistor TCT) and the second switch (initialization transistor IST) to an OFF state, and setting the fourth switch (light emitting control transistor BCT) and the sixth switch (power supply transistor PST) to an OFF state while applying a second voltage to the fourth node by setting the third switch (reset transistor RST) to an ON state by the first control signal.

DESCRIPTION OF EMBODIMENTS

Figure 1:
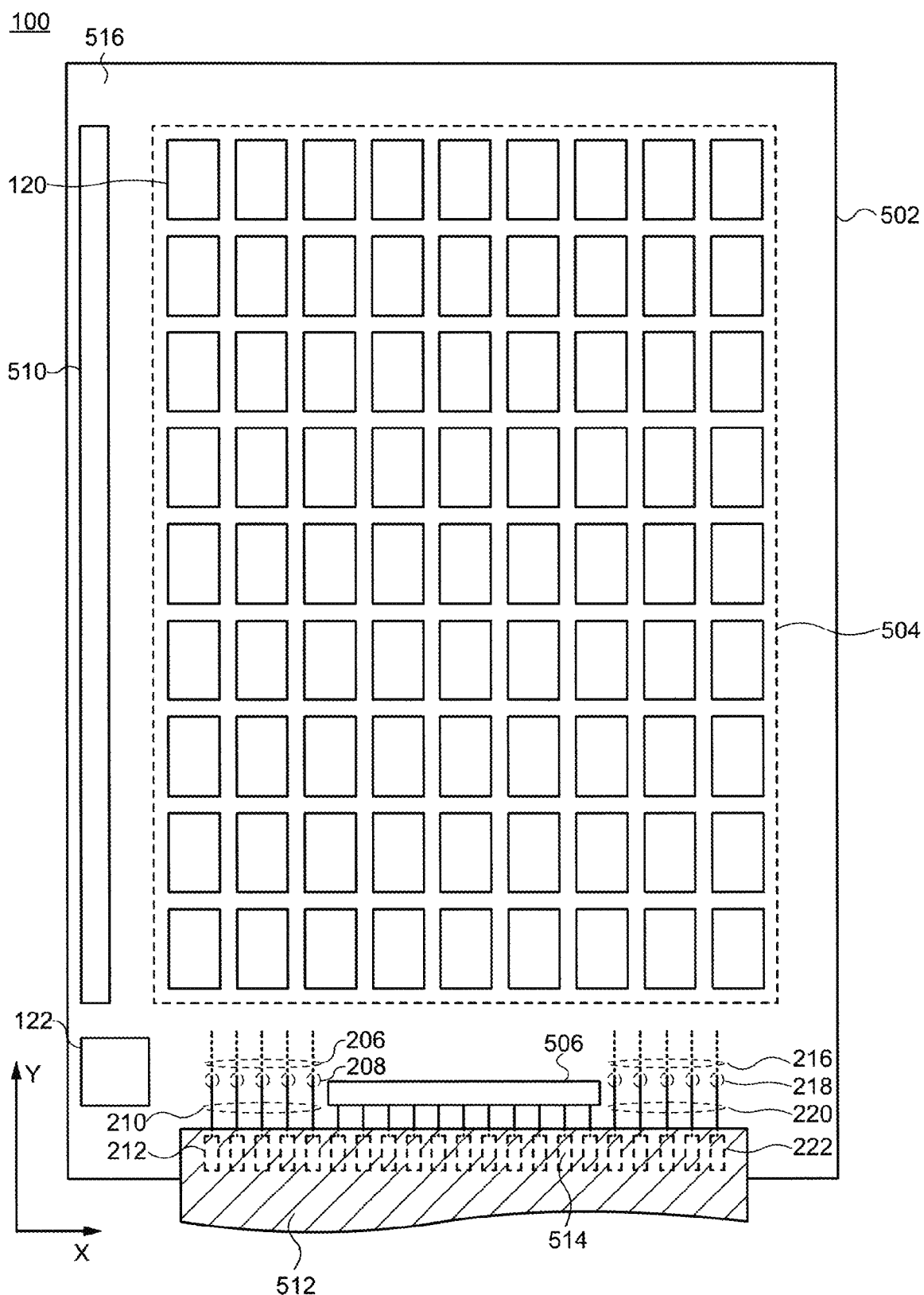
FIG. 1 is a schematic planar diagram of a display device related to one embodiment of the present invention.

The embodiments of the present invention are explained below while referring to the drawings. However, the present invention can be implemented in many different modes and should not to be interpreted as being limited to the description of the embodiments exemplified below. In addition, although the drawings may be schematically represented in terms of width, thickness, shape, and the like of each part as compared with their actual mode in order to make explanation clearer, it is only an example and an interpretation of the present invention is not limited. Furthermore, in the present specification and each drawing, elements having the same functions as those described with reference to the preceding figures are attached with the same reference numerals (or symbols attached with a or b and the like after a number) and a detailed explanation may be omitted. Furthermore, letters added with "first" and "second" to each element are signs of convenience used for distinguishing each element and do not have any further meaning unless otherwise specified.

In the present specification, when a certain member or region is [above (or below)] another member or region, unless otherwise noted this includes not only the case of being directly above [or directly below] another member or region, but also the case of being further above [or further below] another member or region, that is, this also includes the case of above or below another member or region with a separate structural element included therebetween. Furthermore, in the explanation below, unless otherwise stated, a side on which a second substrate is arranged with respect to a first substrate is referred to as [above] or [upper] in a cross-sectional view, and the reverse is explained as [below] or [lower].

The first substrate explained in the present specification has at least one planar shaped main surface, and each layer of an insulating layer, a semiconductor layer and a conductive layer, or each element such as a transistor and a display element are arranged on this main surface. In the explanation below, in the case where an explanation is made as "upper", "upper layer", "upper" or "upper surface" with respect to the first substrate on the basis of one main surface of the first substrate in a cross-sectional view, unless otherwise specified, the explanation is made with reference to the one main surface of the first substrate.

An EL display device including the EL display device having the pixels disclosed in Japanese Patent No. 5612988 is generally used in which a period (light emitting period) during which a light emitting element emits light, and a period during which the light emitting element does not emit light (non-light emitting period) are repeated. For example, when a person looks at the display device, the person recognizes a difference in brightness between light emission and non-light emission of a light emitting element as flicker. The quality of an image displayed on the EL display device decreases due to flickering.

In view of such a problem, one embodiment of the present invention aims to provide a display device that in which a decrease in quality of a displayed image based on flickering is reduced. In addition, one embodiment of the present invention aims to provide a method of driving a display device in which a reduction in quality of an image displayed on the display device is reduced.

1. Background of the Invention

The inventors are studying flickering of an EL display device. In one example of a method for driving an EL display device, a transistor (drive transistor DRT) for controlling the driving of each pixel is reset (also called initialization) in a non-light emitting period, and subsequently an image signal is written in each pixel. Next, a predetermined current flows from the drive transistor DRT to a light emitting element based on the image signal and thereby the light emitting element emits light with a predetermined luminosity. In addition, an operation is sometimes included whereby the light emission of the light emitting element is forcibly stopped so that a screen becomes non-light emitting, that is, a black display. As a means for forcibly stopping the light emission of the light emitting element, for example, a switch is arranged between a power supply and the light emitting element, and the power supply is cut off by turning off the switch regardless of the state of the drive transistor DRT. This operation is called, for example, black insertion, black image insertion or black insertion display and the like. The inventors designed a display device having a pixel arranged with a drive transistor DRT in which a first electrode is connected to a first node (gate electrode), a second electrode is connected to a second node (source electrode), and a third electrode is connected to a third node (drain electrode), a reset transistor RST controlled by a first control signal and having one terminal connected to the second node, a light emitting control transistor BCT controlled by a first control signal together with the reset transistor RST, and having one terminal connected to a power supply line and another terminal connected to the third node, and a light emitting element having a pixel electrode connected to the second node, and a first common electrode. In addition, the inventors have found that in the display device having the pixel described above, since it is possible to adjust a voltage written to the third node in a non-light emitting period and a voltage written to the third node at the time of black insertion after a light-emitting element emits light, it is possible to reduce flickering in a display by using the display device described above.

2. First Embodiment

In the present embodiment, a display device according to one embodiment of the present invention is explained. Furthermore, in the present specification and the like, the display device is explained as an active matrix type EL display device.

2-1. Overall Structure

FIG. 1 is a schematic planar diagram of a display device according to one embodiment of the present invention. The display device 100 includes a substrate 502, a display region 504, an image signal line drive circuit 506, a scanning signal line drive circuit 510, a control circuit 122, a terminal electrode 514 and a periphery region 516. The display region 504, the image signal line drive circuit 506, the scanning signal line drive circuit 510, the control circuit 122, the terminal electrode 514 and the periphery region 516 are arranged on an upper surface of the substrate 502. The display region 504 includes pixels 120 for displaying images on the display device 100. The pixel 120 includes a transistor. An image s displayed on the display device 100 by driving the transistor.

Figure 2:
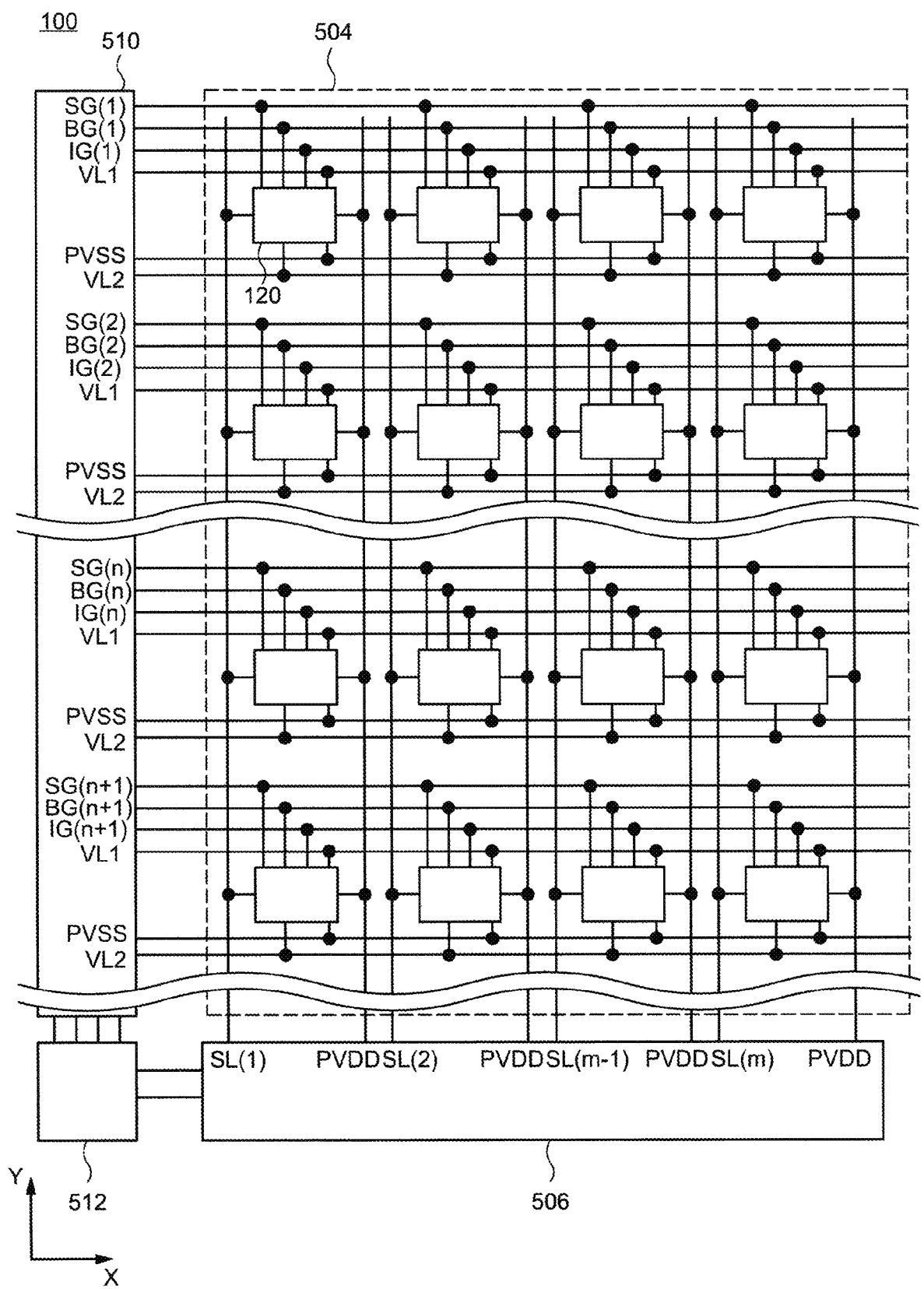
FIG. 2 is a schematic planar diagram of a display device related to one embodiment of the present invention.

A scanning signal line drive circuit 510 and an image signal line drive circuit 506 for controlling driving of a pixel 120 are arranged on the outside of the display region 504. FIG. 1 shows an example in which the image signal line drive circuit 506 uses an IC chip. In addition, although an example is shown in FIG. 2 in which the scanning signal line drive circuit 510 and the image signal line drive circuit 506 are arranged on the upper surface of the substrate 502, the present invention is not limited to this example. For example, a drive circuit formed on a substrate (semiconductor substrate or the like) which is different to the substrate 502 may be arranged above a connector 512 such as the substrate 502 or a flexible printed circuit (FPC) substrate. In addition, a part or all of the circuits included in the scanning signal line drive circuit 510 and the image signal line drive circuit 506 may be formed above a substrate different to the substrate 502 and may be arranged above the substrate 502 and the connector 512. In addition, a drive circuit included in the image signal line drive circuit 506 or part of the drive circuit may be formed directly on the substrate 502. Furthermore, although omitted from FIG. 1, display elements such as a light emitting element arranged in a pixel 120 and various semiconductor elements for controlling the display elements are formed on the upper surface of the substrate 502.

In addition, the display device 100 includes a first wiring 206, a contact hole 208, a first terminal wiring 210, a first terminal 212, a second wiring 216, a contact hole 218, a second terminal wiring 220 and a second terminal 222. These are also arranged on the upper surface of the substrate 502 similar to the scanning signal line drive circuit 510.

Although omitted from FIG. 1, for example, an image signal line for supplying an image signal to each pixel 120, a power supply line for supplying power to each pixel 120, a scanning signal line drive circuit 510, and a control circuit 122 and the like are electrically connected to the first wiring 206 which extends from the outside of the display region 504. The first wiring 206 extends outside of the display region 504 and is electrically connected to the first terminal wiring 210 via the contact hole 208. The first terminal wiring 210 is exposed in end part vicinity of the display device 100 and forms the first terminal 212. The first terminal 212 is connected to the connector 512.

Although omitted from FIG. 1, for example, an image signal line for supplying an image signal to each pixel 120, a power supply line for supplying power to each pixel 120, a scanning signal line drive circuit 510, and a control circuit 122 and the like are similarly electrically connected to the second wiring 216 which extends from the outside of the display region 504. The second wiring 216 extends outside of the display region 504 and is electrically connected to the second terminal wiring 220 via a contact hole 218. The second terminal wiring 220 is exposed in the end vicinity of the display device 100 and forms the second terminal 222. The second terminal 222 is connected to the connector 512. Furthermore, the second wiring 216 may also be the first wiring 206. The contact hole 218 may also be the contact hole 208. The second terminal wiring 220 may also be the first terminal wiring 210. The second terminal 222 may also be the first terminal wiring 210. The second terminal 222 may also be the first terminal 212.

The supply of signals to the pixel 120 is performed from an external circuit (not shown in the diagram) via the first terminal 212, the scanning signal line drive circuit 510 and the image signal line drive circuit 506. The first terminals 212 can be formed aligned along one side of the display device 100. As a result, it is possible to independently supply a voltage and signals to the display region 504 using a single connector 512.

Figure 25:
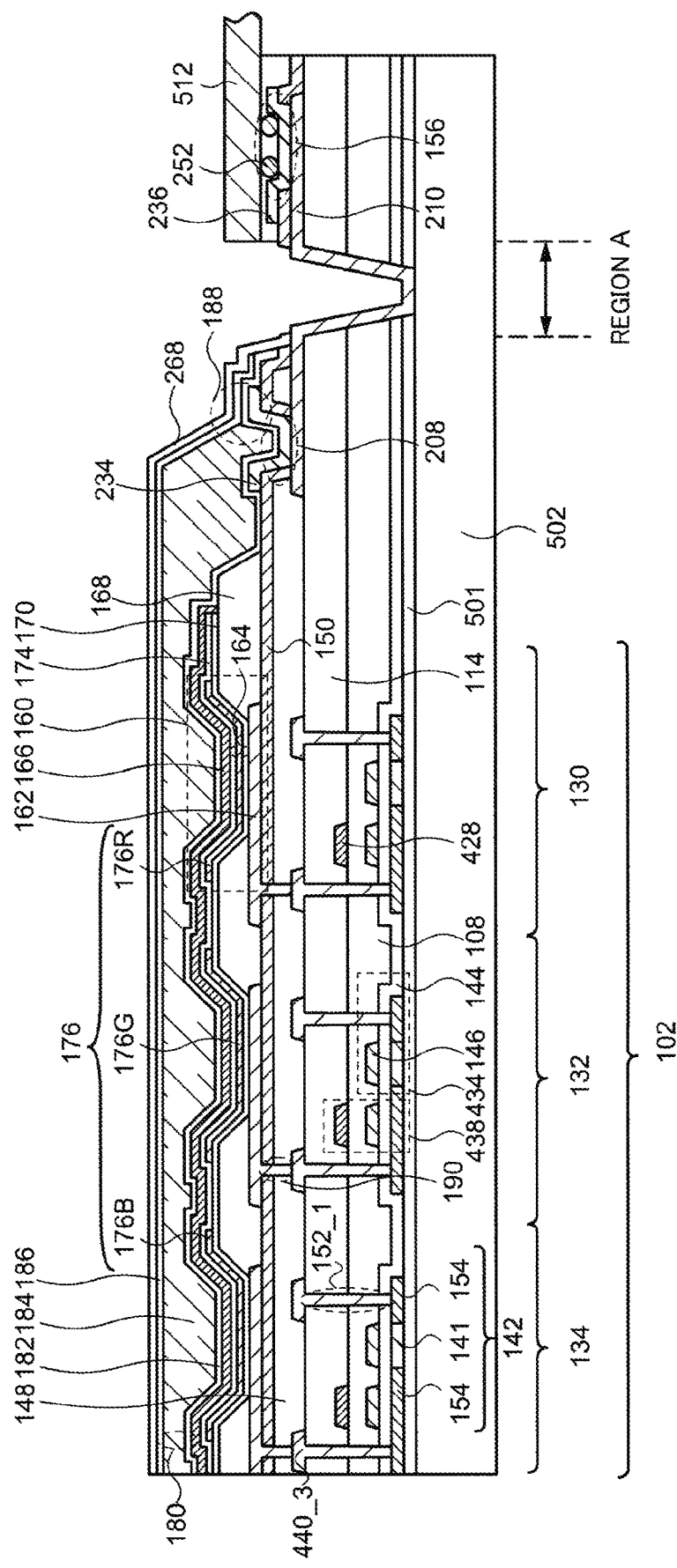
FIG. 25 is a schematic cross-sectional diagram of a display device related to one embodiment of the present invention.

An example is shown in which the arrangement of the pixels 120 is a stripe arrangement. As shown in FIG. 25, each of the pixels 120 may correspond to, for example, three sub-pixels 130, a sub-pixel 132 and a sub-pixel 134. One pixel 102 may be formed by three sub-pixels. Each subpixel is arranged with one display element such as a light emitting element. The color corresponding to a sub-pixel is determined by the characteristics of the light emitting element or a color filter arranged above the sub-pixel. In the present specification, each of the pixels 120 includes one light emitting element, and at least one of the pixels 120 is arranged with a plurality of sub-pixels which provide different colors. In addition, a pixel 120 is a minimum unit forming a part of an image which is reproduced in the display region 504. A sub-pixel included in the display region 504 is included in any one of the pixels.

In addition, in a stripe arrangement, the three sub-pixels 130, sub-pixels 132 and sub-pixels 134 may be formed to give different colors. For example, the sub-pixel 130, the sub-pixel 132 and the sub-pixel 134 can be arranged with light emitting layers which respectively emit the three primary colors of red, green and blue. In addition, a full color display device can be provided by supplying an arbitrary voltage or current to each of the three sub-pixels. Furthermore, there is no limitation to the arrangement of the pixels 120 and a delta array and a pentile array or the like can be adopted.

FIG. 2 is a schematic planar diagram of the display device 100 according to one embodiment of the invention. An image signal, a timing signal for controlling the operation of a circuit, and a power supply and the like are supplied to the control circuit 122 via the plurality of terminal electrodes 514 shown in FIG. 1. The control circuit 122 supplies each signal and power supply voltage to the scanning signal line drive circuit 510 or the image signal line drive circuit 506. The control circuit 122 may generate a new signal or power supply voltage from each signal or power supply voltage using a logic circuit (not shown in the diagram) or a voltage generation circuit (not shown in the diagram) included in the control circuit 122, and supply them to the scanning signal line drive circuit 510 or the image signal line drive circuit 506. The position where the control circuit 122 is arranged is not limited to above the substrate 502 shown in FIG. 1. For example, the control circuit 122 may also be positioned above the connector 512 which is connected to the terminal electrode 514.

The scanning signal line drive circuit 510 or the image signal line drive circuit 506 has the role of driving a light emitting element included in the pixel 120 using each signal or power supply voltage supplied from the control circuit 122 to make the light emitting element emit light and display an image in the display region 504.

The scanning signal line drive circuit 510 is formed to supply a scanning signal SG (n) in common to a plurality of pixels 120 located in the nth row formed in the display region 504. The scanning signal line drive circuit 510 is formed to supply a light emitting control signal BG (n) in common to a plurality of pixels 120 located in the nth row formed in the display region 504. The scanning signal line drive circuit 510 is formed to supply an initialization control signal IG (n) in common to a plurality of pixels 120 located in the nth row formed in the display region 504. The scanning signal line drive circuit 510 is formed to supply a first reset signal VL1 to a plurality of pixels. Here, a voltage of the first reset signal VL1 is denoted as Vrst1. The scanning signal line drive circuit 510 is further formed to supply a second reset signal VL2 to a plurality of pixels. A voltage of the second reset signal VL2 is denoted by Vini. Furthermore, although an example is shown in the present specification whereby Vrst1 and Vini are fixed voltages, Vrst 1 and Vini may also vary with time. Furthermore, although an example is shown in FIG. 2 in which the scanning signal line drive circuit 510 supplies the first reset signal VL1 to a plurality of pixels, the present invention is not limited to this example. The image signal line drive circuit 506 may also supply the first reset signal VL1 to a plurality of pixels. Similarly, the image signal line drive circuit 506 may also supply the second reset signal VL2 to a plurality of pixels. In addition, the first reset signal VL1 and the second reset signal line VL2 may be electrically connected to a terminal electrode 514. At this time, Vrst1 and Vini are supplied from the exterior of the display device 100 via the connector 512. In the present specification, Vrst1 may sometimes be called a reset voltage. In addition, in the present specification, Vini is sometimes called an initialization voltage.

The image signal line drive circuit 506 is formed to supply an image signal SL (m) in common to a plurality of pixels 120 formed located in the mth column formed in the display region 504. The voltage of an image signal is denoted to as Vsig (m), Vsig (n) herein. The image signal is determined according to image data which is displayed in the display region 504. In addition, Vsig (n) is adjusted by a correction method described herein. Furthermore, in the present specification, m and n are arbitrary integers of 1 or more.

2-2. Pixel

Figure 3:
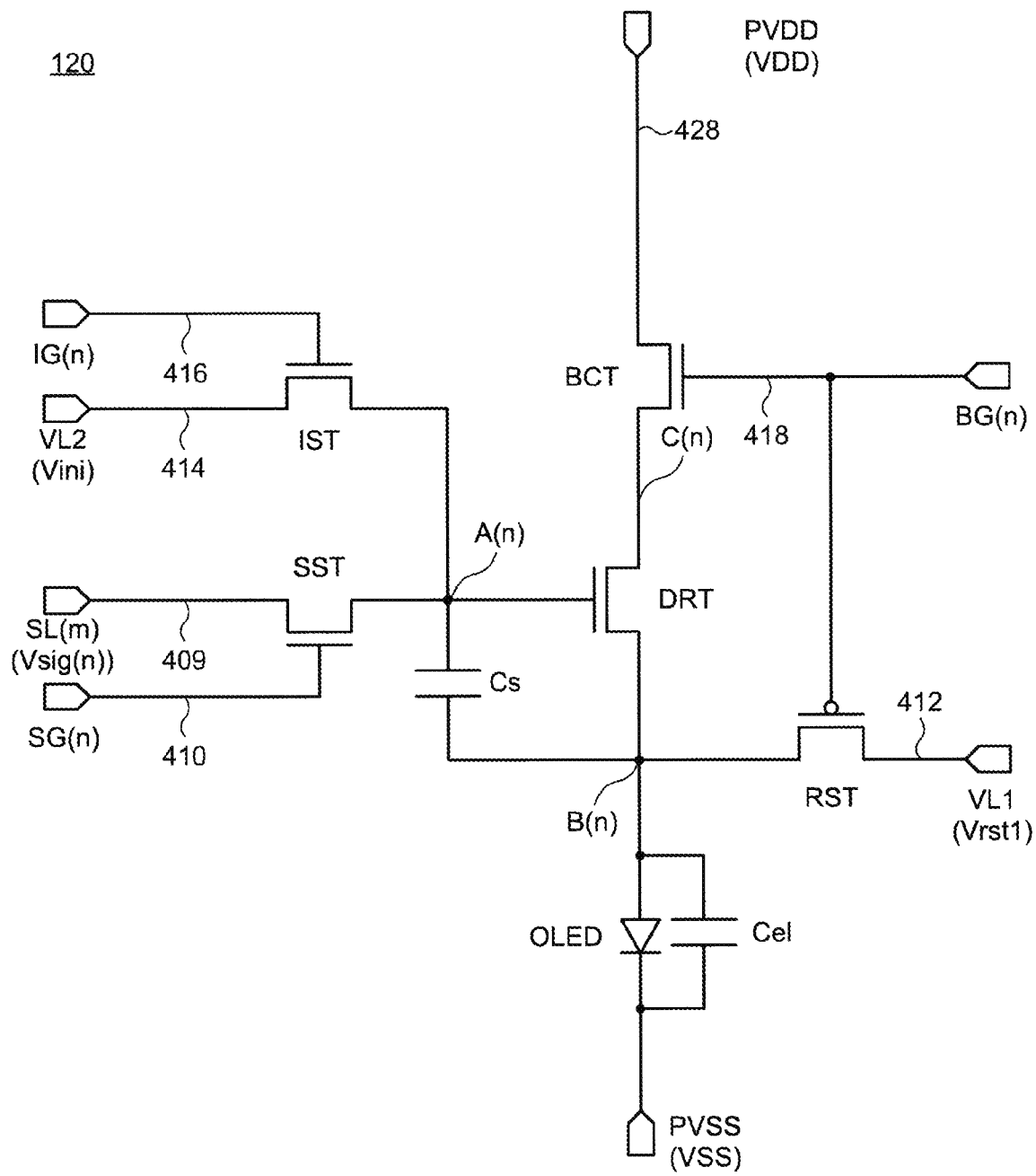
FIG. 3 is a circuit diagram of a pixel included in a display device related to one embodiment of the present invention.

FIG. 3 is a circuit diagram of a pixel 120 according to one embodiment of the present invention, and is also a circuit diagram of a pixel 120 of n rows and m columns shown in FIG. 2. The pixel 120 may also be a sub-pixel.

Each transistor shown in FIG. 3 can include a group 14 element such as silicon or germanium or an oxide which exhibits semiconductor characteristics in a channel region. In the present embodiment, an n-channel type field effect transistor and a p-channel type field effect transistor are included. Furthermore, the circuit structure which is shown in FIG. 3 is merely an example and the present invention is not limited to this structure. For example, the polarity of each transistor may be reversed which inverts the phase of a control signal, and the arrangement of a storage capacitor element Cs may be between a first node and a drive power supply line PVDD. Furthermore, the channel region of these transistors can have various morphologies selected from single crystal, polycrystalline, microcrystalline or amorphous. For example, it is possible to include a low temperature polysilicon (LTPS) which is obtained by melting and recrystallizing amorphous silicon at a relatively low temperature.

As is shown in FIG. 3, a pixel 120 includes a drive transistor DRT, a selection transistor SST (first switch), an initialization transistor IST (second switch), a reset transistor RST (third switch), a light emitting control transistor BCT (fourth switch), a storage capacitor element (second capacitor element) Cs, a light emitting element OLED and an additional capacitor Cel. Each of these transistors includes a first electrode (gate electrode) and a pair of terminals (source electrode, drain electrode) comprised from a second electrode and a third electrode. The storage capacitor element Cs (capacitor element) includes a pair of terminals (first terminal, second terminal). The additional capacitor Cel includes a pair of terminals (first terminal, second terminal). The pair of terminals descried above is also called a pair of electrodes. Furthermore, although an example is shown in FIG. 3 in which the additional capacitor Cel is arranged in parallel with a light emitting element OLED, the present invention is not limited to this example. The additional capacitor Cel may also be a parasitic capacitance of the light emitting element OLED or may include a capacitor element arranged in parallel with the light emitting element OLED and a parasitic capacitance of the light emitting element OLED. As a power supply for driving the light emitting element OLED, a high potential VDD is supplied from the drive power supply line PVDD and a reference potential VSS is supplied from a reference potential line PVSS. The potential Vrst of the reset signal VL is smaller than the high potential VDD supplied from the drive power supply line PVDD and the potential Vcs of the capacitor signal VC, and can be made substantially the same as the reference potential VSS.

The drive transistor DRT plays a role of making a current flow to a light emitting element OLED based on an input image signal and making the light emitting element OLED emit light. The selection transistor SST plays a role of supplying an image signal to the drive transistor DRT. The initialization transistor IST plays the role of supplying Vini to the gate electrode of the drive transistor DRT and resetting the drive transistor DRT. The light emitting control transistor BCT controls connection and disconnection between the drive power supply line PVDD and the drive transistor DRT. It can be said that the light emitting control transistor BCT controls the electrical connection and disconnection between the drive transistor DRT and the light emitting element OLED and between the drive transistor DRT and the additional capacitor Cel. That is, the light emitting control transistor BCT has the role of controlling light emission and non-light emission of the light emitting element OLED. The reset transistor RST has the role of supplying Vrst1 to the first terminal of the light emitting element OLED and resetting the source of the drive transistor DRT and the light emitting element OLED. The first terminal of the light emitting element OLED is a pixel electrode. The storage capacitor element Cs has a role of securing a voltage corresponding to a threshold value of the drive transistor DRT. In addition, the storage capacitor element Cs has a role of maintaining a voltage which is input to the gate of the drive transistor DRT in order for the pixel 120 to emit light. That is, the storage capacitor element Cs plays a role of storing an input image signal, specifically, a gradation level of the input image signal. The light emitting element OLED has diode characteristics. In addition, the light emitting element OLED includes a pixel electrode, the common electrode described above, and a light emitting layer (functional layer, organic layer) positioned between the pixel electrode and the common electrode. The additional capacitor Cel is a capacitor included in the light emitting element OLED. Furthermore, in one embodiment of the present invention, the input image signal may be stored by the additional capacitor Cel and the capacitor element Cs.

The gate electrode of the initialization transistor IST is electrically connected to an initialization control line 416. An initialization control signal IG (n) is supplied to the initialization control line 416. A conductive or non-conductive state of the initialization transistor IST is controlled by a signal which is supplied to the initialization control signal IG (n). When the signal supplied to the initialization control signal IG (n) is low, the initialization transistor IST is in a non-conductive state. When the signal supplied to the initialization control signal IG (n) is high, the initialization transistor IST is in a conductive state. The source electrode of the initialization transistor IST is electrically connected to a second reset voltage line 414. The second reset voltage line 414 is supplied with a second reset signal VL2. The drain electrode of the initialization transistor IST is electrically connected to the gate electrode of the drive transistor DRT, the drain electrode of the selection transistor SST and the first terminal of the storage capacitor element Cs. The second terminal of the storage capacitor element Cs is electrically connected to the source electrode of the drive transistor DRT, the drain electrode of the reset transistor RST, the first terminal of the light emitting element OLED and the first terminal of the additional capacitor Cel.

The gate electrode of the selection transistor SST is electrically connected to the scanning signal line 410. A scanning signal SG (n) is supplied to the scanning signal line 410. A conductive and the non-conductive state of the selection transistor SST are controlled by the signal supplied to the scanning signal SG (n). When the signal supplied to the scanning signal SG (n) is low, the selecting transistor SST is in a non-conductive state. When the signal supplied to the scanning signal SG (n) is high, the selection transistor SST is in a conductive state. The source electrode of the selection transistor SST is electrically connected to an image signal line 409. An image signal SL (m) is supplied to the image signal line 409. The drain electrode of the selection transistor SST is electrically connected to the drain electrode of the drive transistor DRT and the first terminal of the storage capacitor element Cs.

The gate electrode of the light emitting control transistor BCT and the gate electrode of the reset transistor RST are electrically connected to a light emitting control line 418. A light emitting control signal BG (n) is supplied to the light emitting control line 418. A conducting state or a non-conducting state of the light emitting control transistor BCT and the reset transistor RST are controlled by a signal supplied to the light emitting control signal BG (n). When the signal supplied to the light emitting control signal BG (n) is low, the light emitting control transistor BCT is in a non-conducting state. When the signal supplied to the light emitting control signal BG (n) is high, the light emitting control transistor BCT is in a conducting state. When the signal supplied to the light emitting control signal BG (n) is low, the reset transistor RST is in a conducting state. When the signal supplied to the light emitting control signal BG (n) is high, the reset transistor RST is in a non-conducting state. The drain electrode of the light emitting control transistor BCT is electrically connected to the drive power supply line PVDD. The driving power supply line PVDD is a drive power supply line 428. The source electrode of the light emitting control transistor BCT is electrically connected to the drain electrode of the drive transistor DRT. The source electrode of the reset transistor RST is electrically connected to a first reset voltage line 412. The first reset voltage line 412 is supplied with the first reset signal VL1.

The second terminal of the light emitting element OLED and the second terminal of the additional capacitor Cel are electrically connected to a reference voltage line PVSS.

The drain electrode of the initialization transistor IST, the drain electrode of the selection transistor SST, the gate electrode of the drive transistor DRT, and the first terminal of the storage capacitor element Cs are electrically connected to a first node A (n). The drain electrode of the reset transistor RST, the source electrode of the drive transistor DRT, the second terminal of the storage capacitor element Cs, the first terminal of the light emitting element OLED, and the first terminal of the additional capacitor Cel are electrically connected to a second node B (n). The drain electrode of the drive transistor DRT and the source electrode of the light emitting control transistor BCT are electrically connected to a third node C (n).

Since the first reset voltage line 412 supplies a common voltage Vrst1 to each pixel, it may sometimes be called a "second common electrode" in the present specification. Since the second reset voltage line 414 supplies a common voltage Vini to each pixel, it may sometimes be called a "third common electrode" in the present specification. Furthermore, Vrst1 and Vini are substantially the same voltage. Since Vrst1 and Vini are substantially the same, the voltage of the gate electrode of the drive transistor DRT and the voltage of the source electrode of the drive transistor DRT can be made substantially the same when resetting the drive transistor DRT, thereby resetting of the drive transistor DRT and the threshold value correction of the drive transistor DRT can be accurately performed.

In the present specification, a conducting state refers to a state in which a source electrode and a drain electrode of a transistor are electrically conducting with each other, a state in which a current flows to a transistor, a state in which the transistor is on (ON), and a state in which a switch is on (ON). In addition, in the present specification, a non-conducting state refers to a state in which the source electrode and the drain electrode of the transistor are not electrically conducting, a state in which a current does not flow to the transistor, a state in which the transistor is off (OFF), and a state in which the switch is off (OFF). Furthermore, in each transistor, the source electrode and the drain electrode may sometimes be interchanged according to the voltage of each electrode. In addition, it would be easy for a person skilled in the art to understand that even a small current flows such as a leak current even in a state when the transistor or the switch does not flow a current, as state in which a current does not flow, or the transistor is in an OFF state.

2-3. Driving Method

Figure 4:
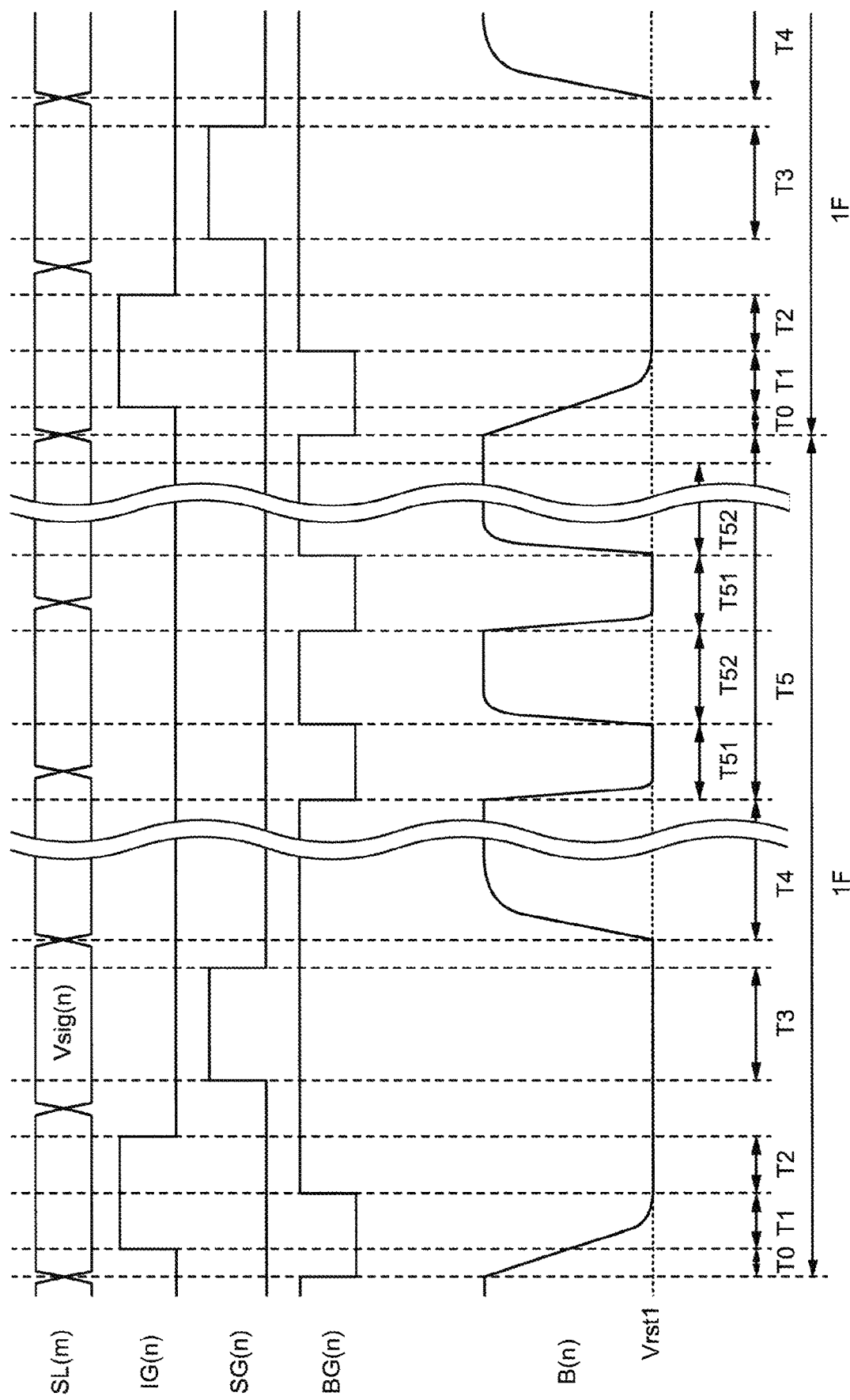
FIG. 4 is a timing chart of the pixel shown in FIG. 3.

A method of driving a display device according to one embodiment of the present invention is explained using FIG. 4 to FIG. 11. Furthermore, in the explanation using FIG. 4 to FIG. 11, an explanation similar to content explained in FIG. 1 to FIG. 3 may be omitted. FIG. 4 is a timing chart of the pixel shown in FIG. 3.

Figure 5:
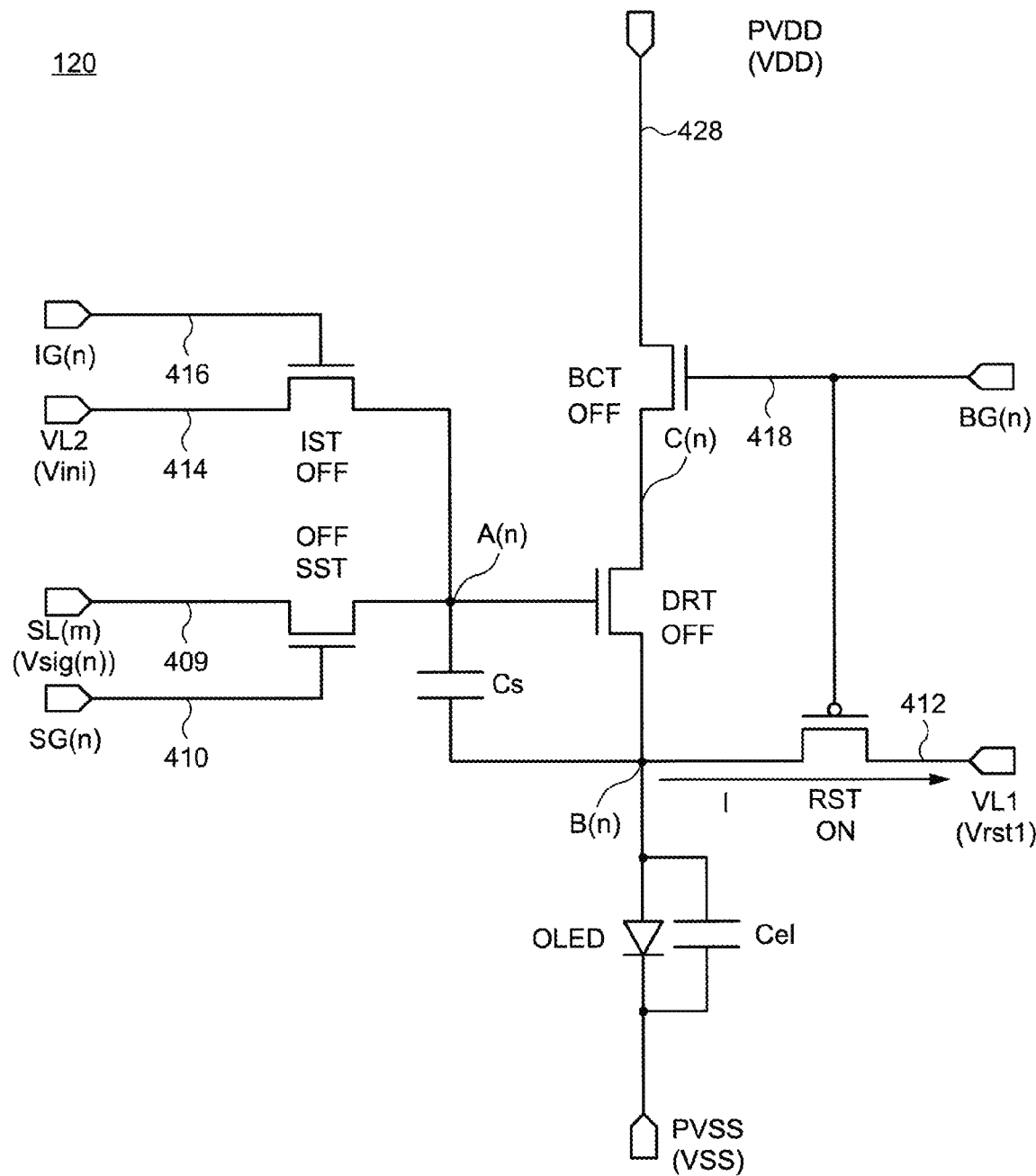
FIG. 5 is a schematic diagram showing an operation state of a pixel in the timing chart shown in FIG. 4.

FIG. 5 shows a state of pixels in the nth row and the mth column in a time period T0 of the timing chart shown in FIG. 4. In a time period T1, first, a low voltage is supplied to the initialization control signal IG (n), the scanning signal SG (n), and the light emitting control signal BG (n). In this way, the initialization transistor IST, the selection transistor SST and the light emitting control transistor BCT are in a non-conducting state. On the other hand, the reset transistor RST is in a conducting state. Furthermore, although the drive transistor DRT is in a non-conducting state, it may also be in a conducting state. In this way, Vrst1 which is supplied to the first reset signal VL1 is supplied o the drain electrode of the reset transistor RST, the source electrode of the drive transistor DRT, the second terminal of the storage capacitor element Cs, the first terminal (pixel electrode) of the light emitting element OLED, and the first terminal of the additional capacitor Cel. The voltage of the node B (n) is Vrst1.

Figure 6:
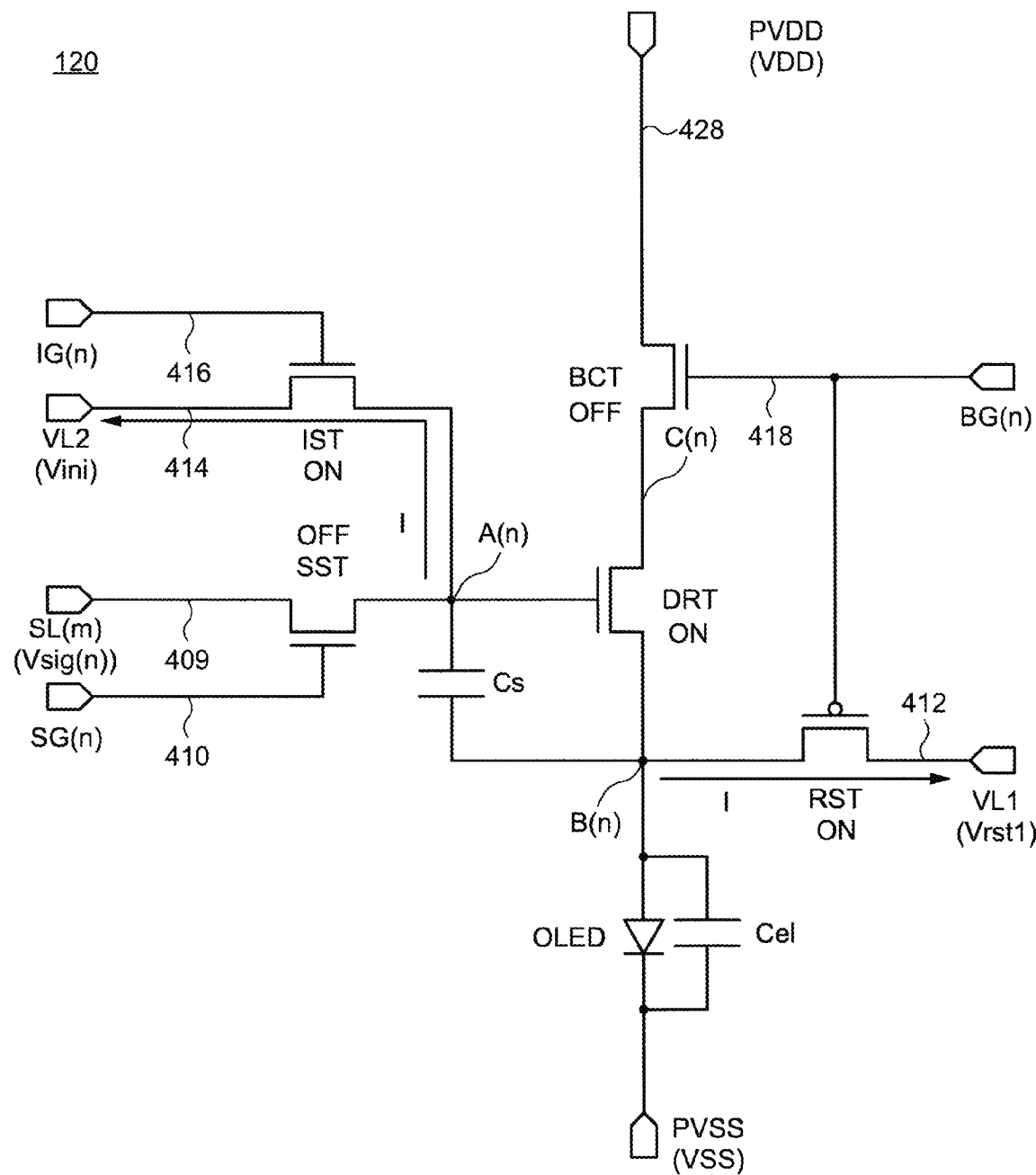
FIG. 6 is a schematic diagram showing an operation state of a pixel in the timing chart shown in FIG. 4.

FIG. 6 shows a state of a pixel in the nth row and the mth column in the time period T1 of the timing chart shown in FIG. 4. Next, in the time period T1, the voltage which is supplied to the initialization control signal IG (n) changes from a low voltage to a high voltage. In this way, the initialization transistor IST enters a conductive state. In this way, the initialization voltage Vini which is supplied to the initialization control line 416 is supplied to the drain electrode of the initialization transistor IST, the gate electrode of the drive transistor DRT, the drain electrode of the selection transistor SST, and the first terminal of the storage capacitor element Cs. The voltage of the node A (n) is Vini.

In the time period T1, the source electrode of the drive transistor DRT and the gate electrode of the drive transistor DRT are reset (initialized). Furthermore, the potential of Vini is higher than the potential of Vrst, and this potential difference is larger than the threshold voltage of the drive transistor DRT. In this way, by the operations in the time period T1, the drive transistor DRT is reset from the state based on the previous image signal, and forcibly switched ON.

Figure 7:
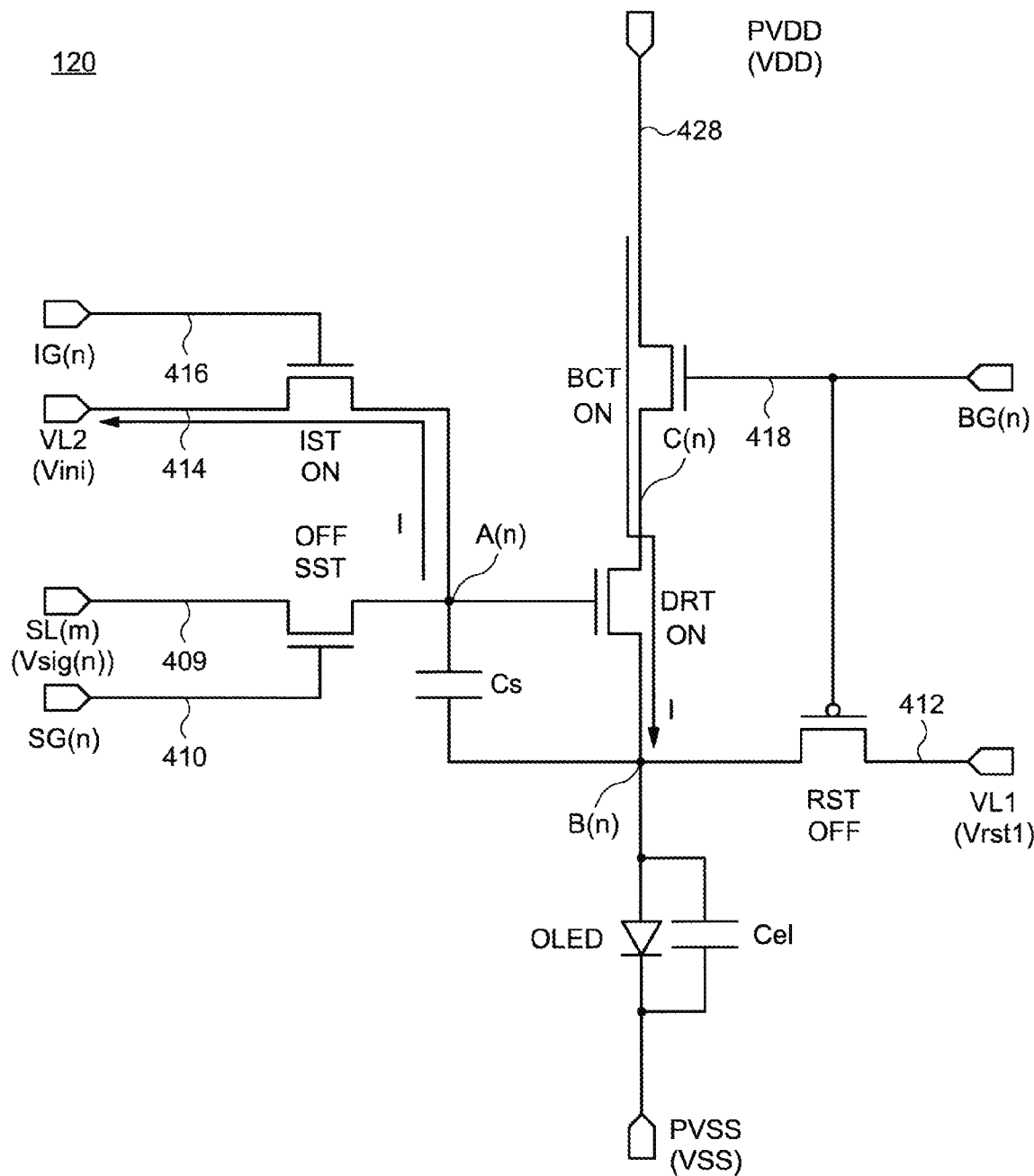
FIG. 7 is a schematic diagram showing an operation state of a pixel in the timing chart shown in FIG. 4.

FIG. 7 shows a state of a pixel in the nth row and the mth column in the time period T2 of the timing chart shown in FIG. 4. In the time period T2, the voltage which is supplied to the light emitting control signal BG (n) changes from a low voltage to a high voltage. In this way, the light emitting control transistor BCT enters a conducting state. In addition, the reset transistor RST is in a non-conducting state. In this way, since the light emitting control transistor BCT is connected to the drive power supply line 428, the voltage of the node C (n) becomes the voltage VDD which is supplied to the drive power supply line 428. In this way, a current flows to the drive transistor DRT (the drive transistor DRT is put in a conductive state by the operations in the time period T1). Therefore, the source electrode of the drive transistor DRT and the second terminal of the storage capacitor element Cs are charged. The voltage of the node A (n) is Vini, and when the voltage of the source electrode of the drive transistor DRT becomes Vini-Vthn, the drive transistor DRT enters a non-conducting state. The voltage of the node A (n) is maintained at Vini. The voltage of the node B (n) is Vini-Vthn. The voltage of the node C (n) is VDD. Furthermore, Vthn is the threshold voltage of the drive transistor. Therefore, a charge corresponding to the threshold voltage of the drive transistor DRT can be stored between the node A (n) and the node B (n), that is, the storage capacitor element Cs. That is, the display device of the present invention can correct a threshold value of the drive transistor DRT in the time period T2. Therefore, it is possible to suppress uneven luminosity due to variations in image signals.

Figure 8:
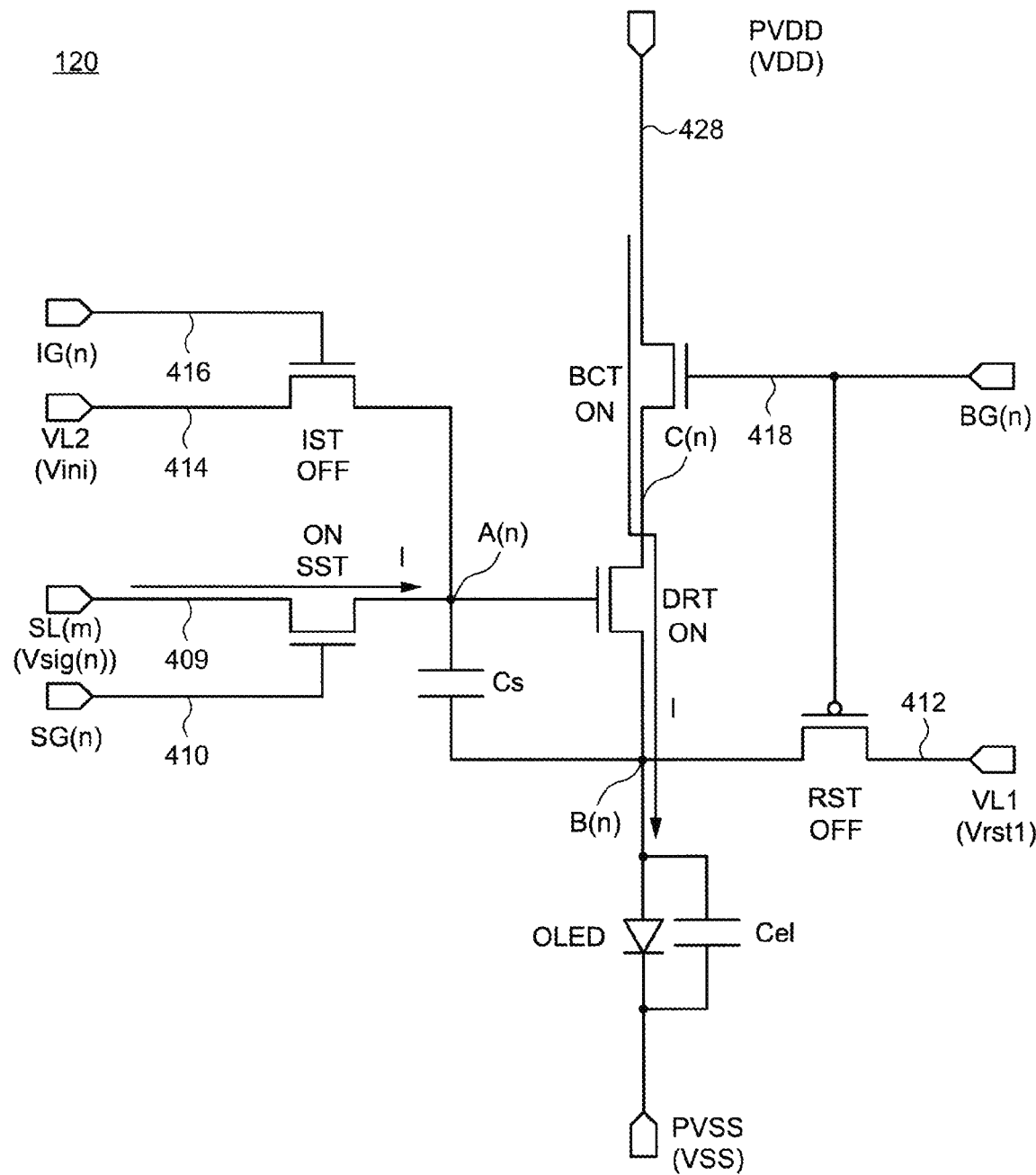
FIG. 8 is a schematic diagram showing an operation state of a pixel in the timing chart shown in FIG. 4.

FIG. 8 shows the state of a pixel in the nth row and the mth column in the time period T3 of the timing chart shown in FIG. 4. Between the time period T2 and the time period T3, the voltage which is supplied to the initialization control signal IG (n+1) changes from a high voltage to a low voltage. In this way, the initialization transistor IST is in a non-conducting state. In addition, between the time period T2 and the time period T3, the voltage which is supplied to the scanning signal SG (n) changes from a low voltage to a high voltage. In this way, the selection transistor SST enters a conducting state. When the voltage Vsig (n) of the image signal SL (m) is supplied to the image signal line 409, the drain electrode of the selection transistor SST, the drain electrode of the initialization transistor IST, the gate electrode of the drive transistor DRT, and the first terminal of the storage capacitor element Cs becomes Vsig (n). That is, the voltage of the node A (n) is Vsig (n). The voltage of the node B (n) is Vini-Vthn. The voltage of the node C (n) is VDD. At this time, even if the threshold voltage of the drive transistor DRT varies according to each pixel, a potential difference corresponding to each threshold voltage is acquired between the node A (n) and the node B (n) of each pixel by the previous operation, and since a drive transistor is controlled so that the image signal Vsig is added, the drive transistor DRT can flow a current according to the voltage of each image signal.

Figure 9:
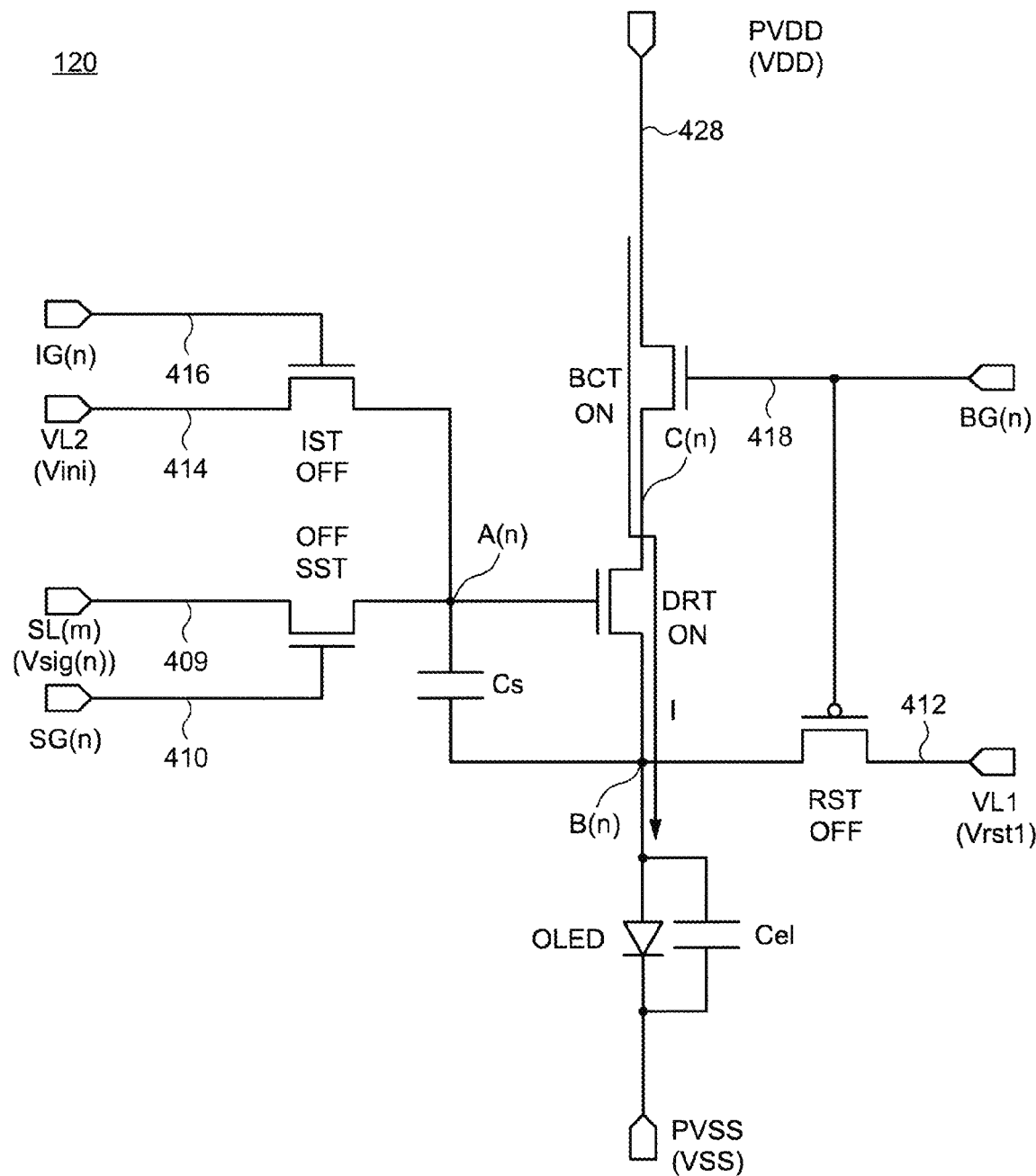
FIG. 9 is a schematic diagram showing an operation state of a pixel in the timing chart shown in FIG. 4.

FIG. 9 shows the state of a pixels in the nth row and the mth column in the time period T4 of the timing chart shown in FIG. 4. Between the time period T3 and the time period T4, the voltage which is supplied to the scanning signal SG (n) changes from a high voltage to a low voltage. In this way, the selection transistor SST is in a non-conducting state. Therefore, the drive transistor DRT can flow a current according to the voltage of each image signal. Therefore, a current flows from the driving power supply line 428 to the reference voltage line PVSS, and the light emitting element OLED emits light.

Figure 10:
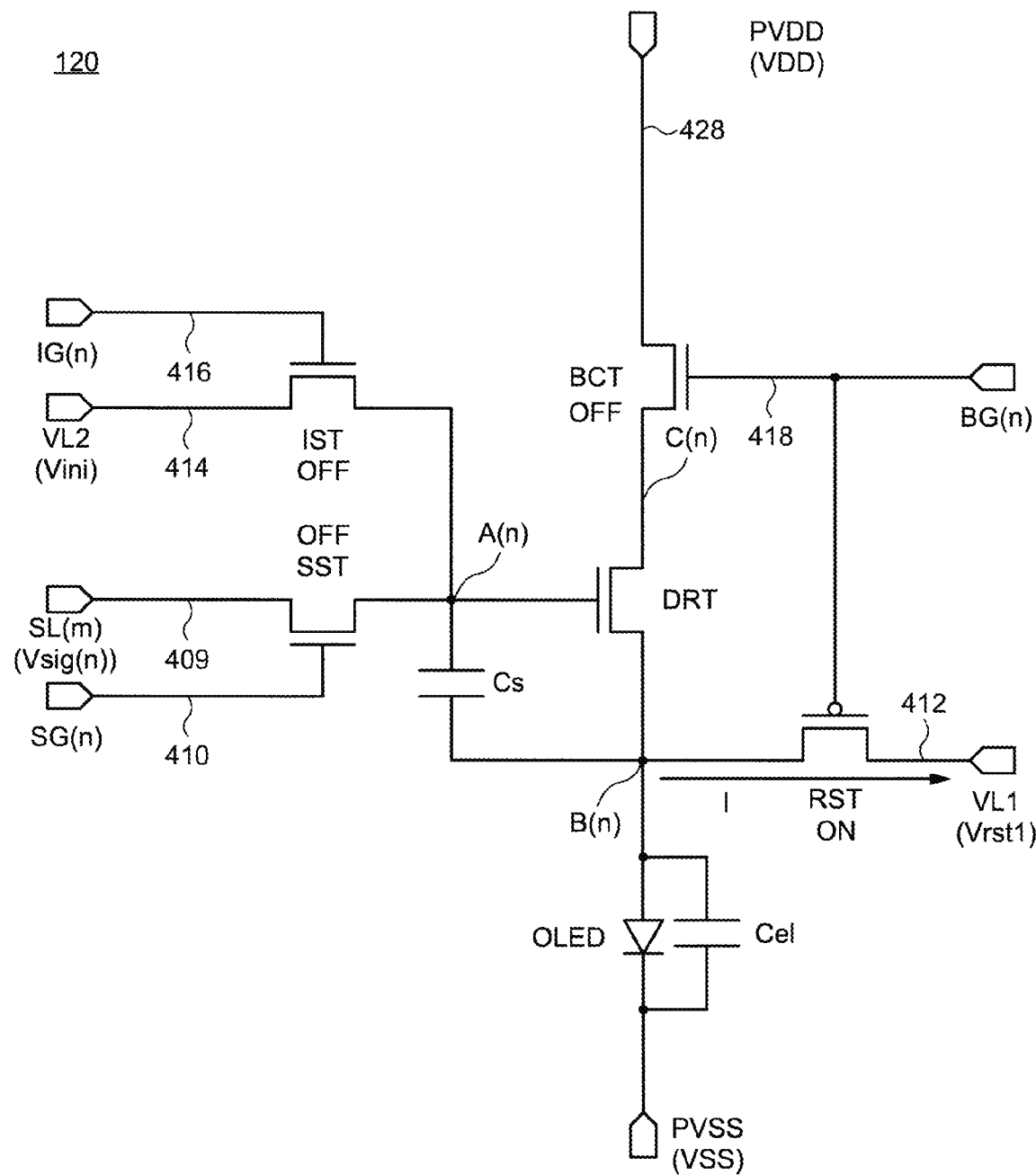
FIG. 10 is a schematic diagram showing an operation state of a pixel in the timing chart shown in FIG. 4.
Figure 11:
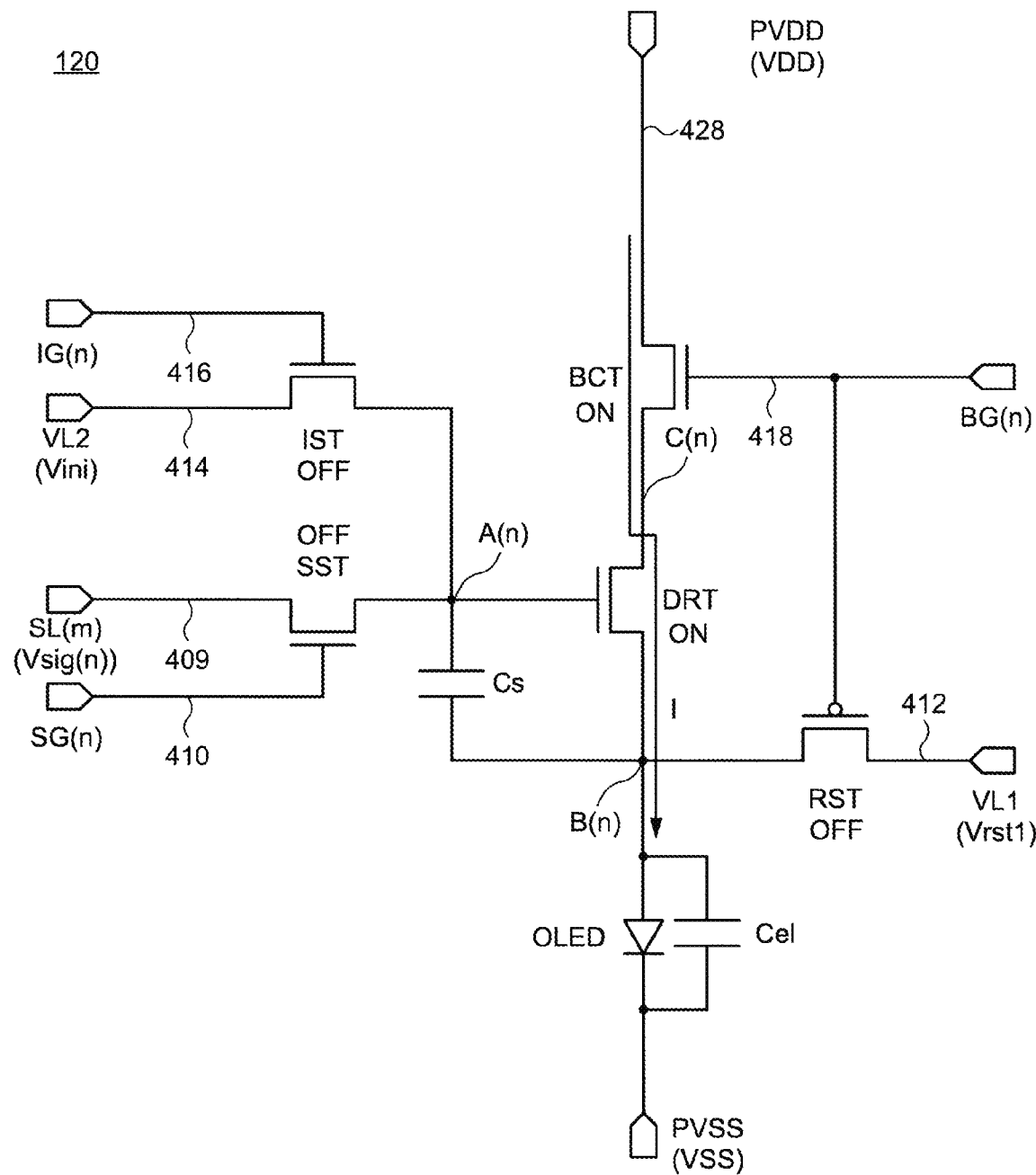
FIG. 11 is a schematic diagram showing an operation state of a pixel in the timing chart shown in FIG. 4.

FIG. 10 and FIG. 11 show the state of a pixel in the nth row and the mth column in the time period T5 of the timing chart shown in FIG. 4. In the display device according to one embodiment of the present invention, the time period T5 includes a time period T51 in which black insertion is performed at intervals of ⅟60 seconds or less. FIG. 10 shows the state of a pixel in the nth row and the mth column in the time period T51 in the timing chart shown in FIG. 4. Since FIG. 10 is the same as the operation at the beginning of the time period T1 which was explained in FIG. 5, a detailed explanation is omitted. In addition, FIG. 11 shows the state of a pixel in the nth row and the mth column in the time period T52 in the timing chart shown in FIG. 4. Since FIG. 11 is the same as the operation in the time period T4 which was explained in FIG. 9, a detailed explanation is omitted. In the time period T5, Vrst1 can be supplied to a pixel electrode of a light emitting element OLED by setting the reset transistor RST to a conductive state. That is, the display device 100 can display black. Black insertion consists of, for example, a one-time black display among 60 Hz in a non-light emitting period and 59 times is black insertion.

A time period including the time period shown in FIG. 4 to FIG. 11 is set as 1 frame (1F), and an image of one screen is switched for every 1F.

As was explained above, the display device according to one embodiment of the present invention simultaneously controls the reset transistor RST and the light emitting control transistor BCT by a light emitting control signal BG (n). In the display device according to one embodiment of the present invention, it is possible to adjust a voltage supplied to a pixel electrode of a light emitting element when the drive transistor DRT is reset (initialization) and a voltage supplied to a pixel electrode of a light emitting element at the time of black insertion. In this way, by using the display device according to one embodiment of the present invention or the driving method of the display device according to one embodiment of the present invention, it is possible to adjust a change in a voltage supplied to a pixel electrode when shifting from a non-light emitting period to a light emitting period, and a change in a voltage supplied to a pixel electrode when shifting from black insertion to a light emitting period. Therefore, it is possible to reduce flicker by using the display device according to one embodiment of the present invention or the driving method of the display device according to one embodiment of the present invention.

Therefore, it is possible to provide a display device in which a decrease in image quality of a displayed image can be reduced by using a display device according to one embodiment of the present invention or a driving method of a display device according to one embodiment of the present invention.

3. Second Embodiment

In the present embodiment, another structure of a display device according to one embodiment of the present invention is explained. Furthermore, explanations related to the same structure as in the first embodiment may be omitted.

Figure 12:
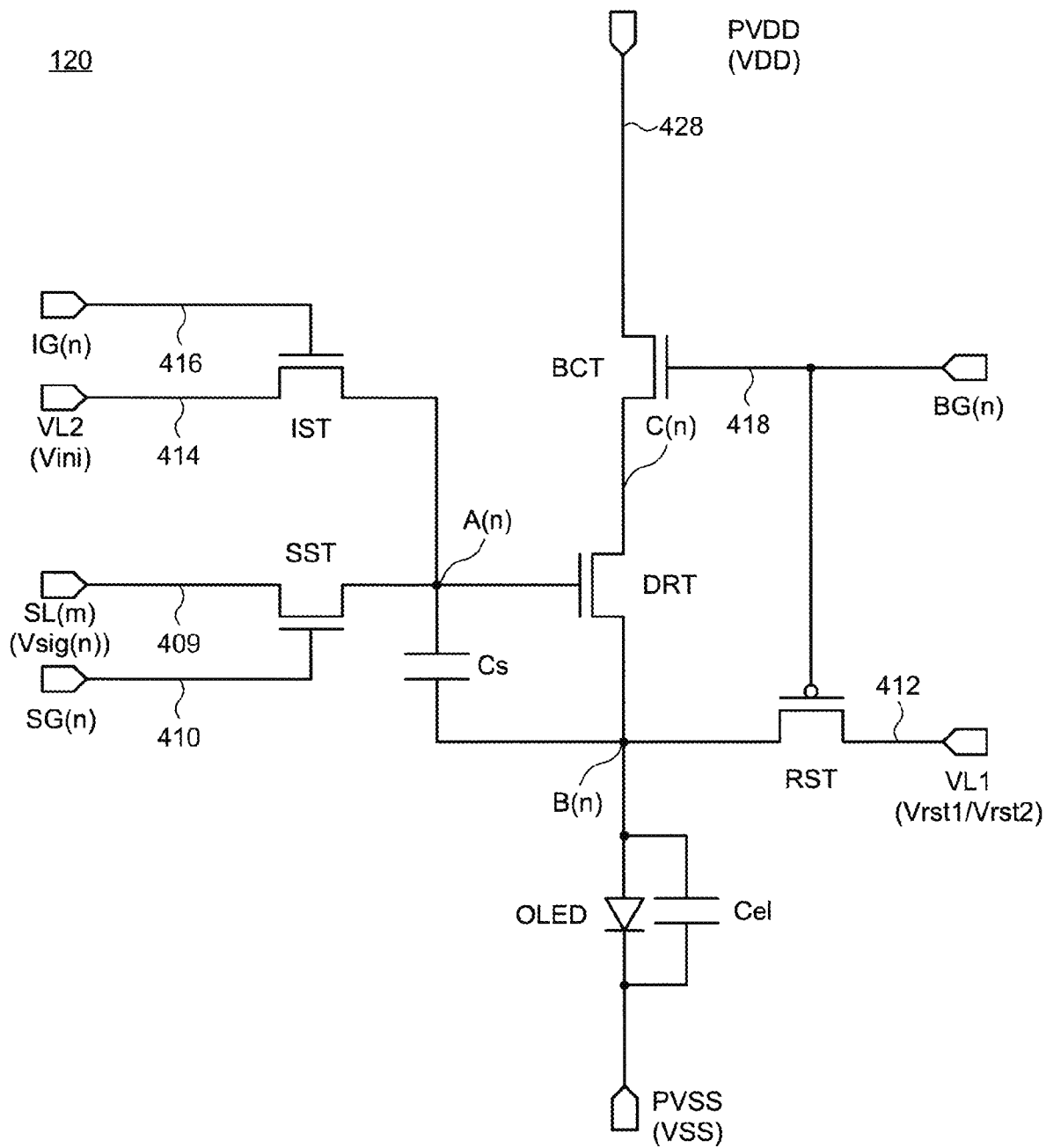
FIG. 12 is a circuit diagram of a pixel included in a display device related to one embodiment of the present invention.

FIG. 12 is a circuit diagram of a pixel 120 according to one embodiment of the present invention. A circuit diagram of pixels 120 of n rows and m columns shown in FIG. 2 is shown. The pixel 120 may also be a sub-pixel. In FIG. 12, compared to the circuit diagram shown in FIG. 3, the voltage of a first reset signal is different in that it is selected from one of two voltages Vrst1 and Vrst2. Since the other points are the same as the explanation of FIG. 3, an explanation here is omitted. Furthermore, in the present specification, Vrst1 and Vrst2 may be respectively referred to as a first voltage and a second voltage.

Figure 13:
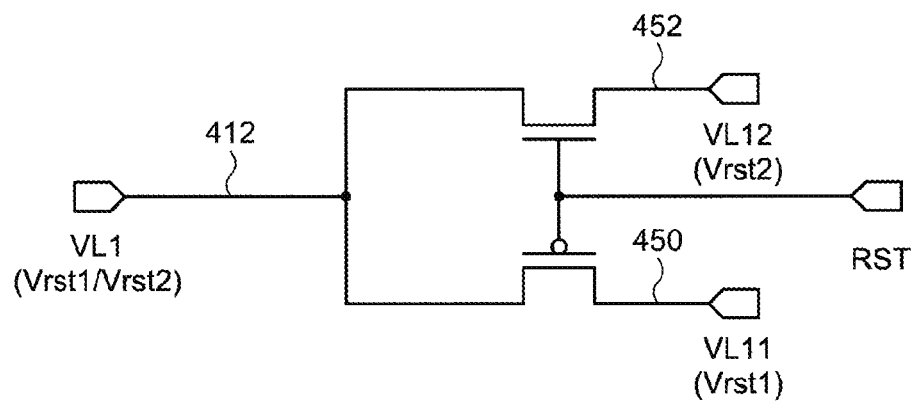
FIG. 13 is a circuit diagram of a circuit for controlling a voltage supplied to a pixel included in a display device related to one embodiment of the present invention.

FIG. 13 shows a circuit diagram of a voltage selection circuit which selects one of Vrst1 and Vrst2. For example, the voltage selection circuit is formed from two switches as is shown in FIG. 13. One of the two switches is an n-channel type field effect transistor, and one is a p-channel type field effect transistor. A drain electrode of the p-channel type field effect transistor is electrically connected to a third reset voltage line 450. A third reset signal VL11 is supplied to the third reset voltage line 450. The voltage of the third reset signal VL11 is Vrst1. A source electrode of the n-channel field effect transistor is electrically connected to a fourth reset voltage line 452. A fourth reset signal VL12 is supplied to the fourth reset voltage line 452. The voltage of the fourth reset signal VL12 is Vrst2. The gate electrode of the n-channel type field effect transistor and the gate electrode of the p-channel type field effect transistor are electrically connected to a fifth reset signal RST (n). The drain electrode of the n-channel type field effect transistor and the source electrode of the p-channel type field effect transistor are electrically connected to the first reset voltage line 412. A first reset signal VL1 is supplied to the first reset voltage line 412.

In the voltage selection circuit shown in FIG. 13, when a signal which is supplied to the fifth reset signal RST (n) is high, the n-channel type field effect transistor is in a conducting state and the p-channel type field effect transistor is in a non-conducting state. Therefore, the voltage Vrst2 of the fourth reset signal VL12 is supplied to the first reset signal VL1. In addition, when a signal supplied to the fifth reset signal RST (n) is low, the n-channel type field effect transistor is in a non-conducting state and the p-channel type field effect transistor is in a conducting state. Therefore, the voltage Vrst1 of the third reset signal VL11 is supplied to the first reset signal VL1.

In the case where the voltage selection circuit is formed by an n-channel type transistor and a p-channel type transistor as is shown in FIG. 13, the input of the higher potential among Vrst1 and Vrst2 is controlled by the p-channel type transistor, and the input of the lower potential is controlled is controlled by the n-channel type transistor. That is, Vrst1>Vrst2. At this time, it is preferred that the high level of the fifth reset signal RST is higher than Vrst1 and the potential difference with Vrst2 is equal to or higher than the threshold voltage of the n-channel type transistor, and the low level is lower than Vrst2, and the potential difference with Vrst1 is equal to or higher than the threshold voltage of the p-channel type transistor.

By adopting the structure shown in FIG. 13 for the voltage selection circuit, it is possible to reduce the number of elements, reduce the layout area, and reduce the mounting area. Furthermore, the voltage selection circuit is not limited to the structure in FIG. 13. For example, each of the two switches which form the voltage selection circuit may be an analog switch (also called a transmission gate) formed form an n-channel type field effect transistor and a p-channel type field effect transistor. By using an analog switch, the voltage selection circuit can reliably transmit and block an analog voltage of Vrst1 and Vrst2.

Figure 14:
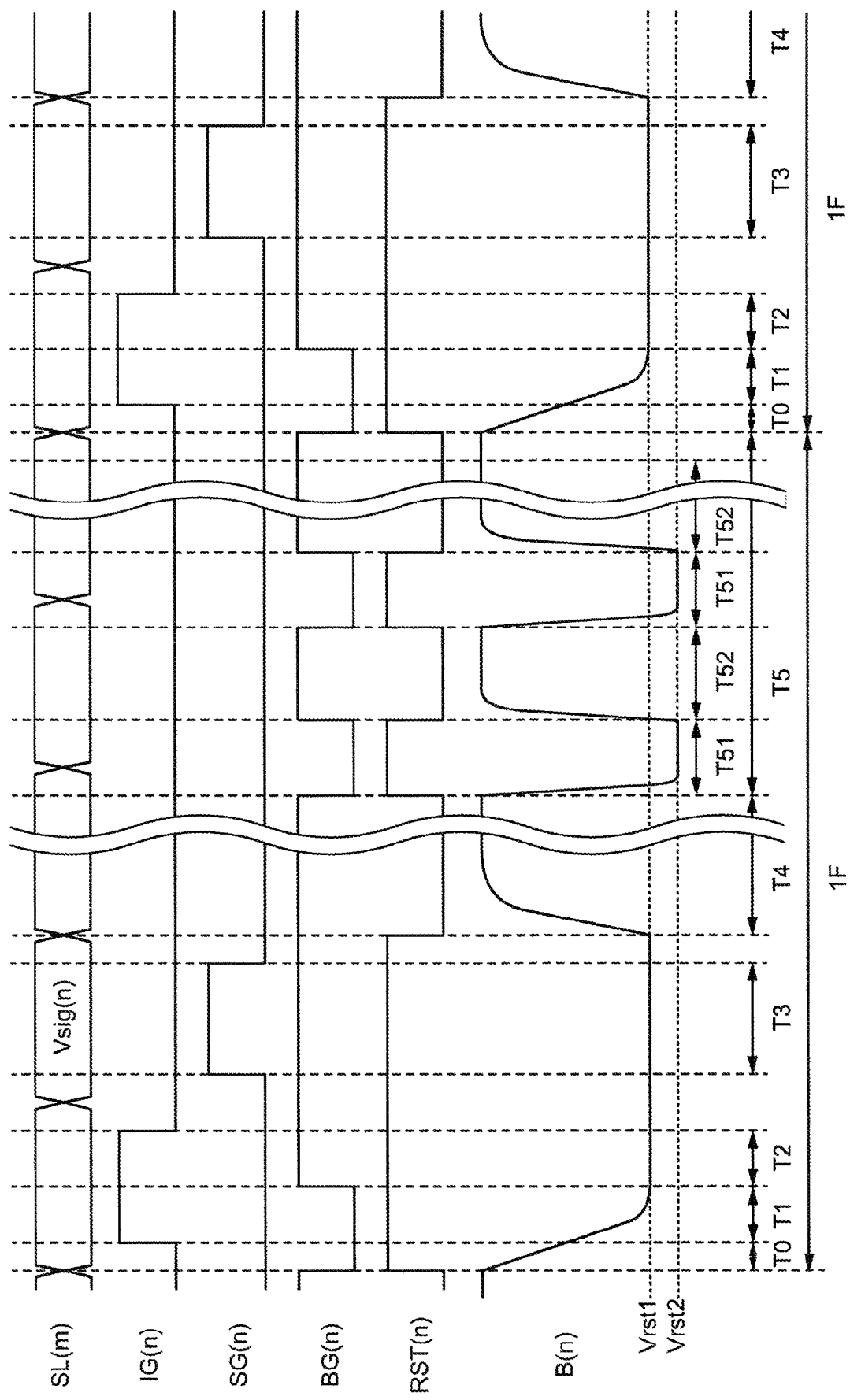
FIG. 14 is a timing chart of the pixel shown in FIG. 12.

FIG. 14 is a timing chart of the pixel shown in FIG. 12. Compared to the timing chart shown in FIG. 4, the timing chart shown in FIG. 14 is different in that the voltage supplied to the node A (n) where a pixel electrode of a light emitting element OLED is electrically connected is different in the time period T1 and the time period T5. Specifically, Vrst1 is supplied during a non-light emitting time period such as the time period T1. Vrst2 is supplied in the black insertion in the time period T5. Since the other points are the same as those explained in FIG. 4, an explanation here is omitted.

In addition, in one embodiment of the present invention, apart from one of Vrst1 and Vrst2 being selected as the first reset signal VL1 by the voltage selection circuit, the state of a pixel is the same as the state of a pixel explained in FIG. 5 to FIG. 11. In this way, an explanation of the state of each pixel in the timing chart of FIG. 14 is omitted here.

Furthermore, in one embodiment of the present invention, a voltage VDD_H which is supplied to a drive power supply line 428 is 10 V. A reference voltage VSS which is supplied to a reference voltage line PVSS is 0V. Vrst1 is −2 V and Vini is 2 V. Although it is preferred that Vrst2 is lower than Vrst1, Vrst2 may also be substantially the same as Vrst1. By changing the voltage between Vrst1 and Vrst2, it is possible to finely adjust a voltage at the time of black insertion.

As was explained above, the display device according to one embodiment of the present invention simultaneously controls the reset transistor RST and the light emitting control transistor BCT according to a light emitting control signal BG (n). The display device in one embodiment of the present invention can finely adjust a voltage which is supplied to a pixel electrode of a light emitting element via the reset transistor RST at the time of black insertion. In this way, it is possible to more precisely adjust the voltage which is supplied to a pixel electrode of a light emitting element at the time of resetting (initialization) of the drive transistor DRT and the voltage which is supplied to a pixel electrode of a light emitting element at the time of black insertion. That is, by using the display device in one embodiment of the invention or the driving method of the display device in one embodiment of the present invention, it is possible to further reduce flicker in a display.

Therefore, it is possible to provide a display device which can reduce a decrease in image quality of a displayed image by using the display device according to one embodiment of the present invention or the driving method of a display device according to one embodiment of the present invention.

4. Third Embodiment

In the present embodiment, another structure of a display device according to one embodiment of the present invention is explained. Furthermore, an explanation of a structure which is similar to the first embodiment or the second embodiment may be omitted.

4-1. Overall Structure

Figure 15:
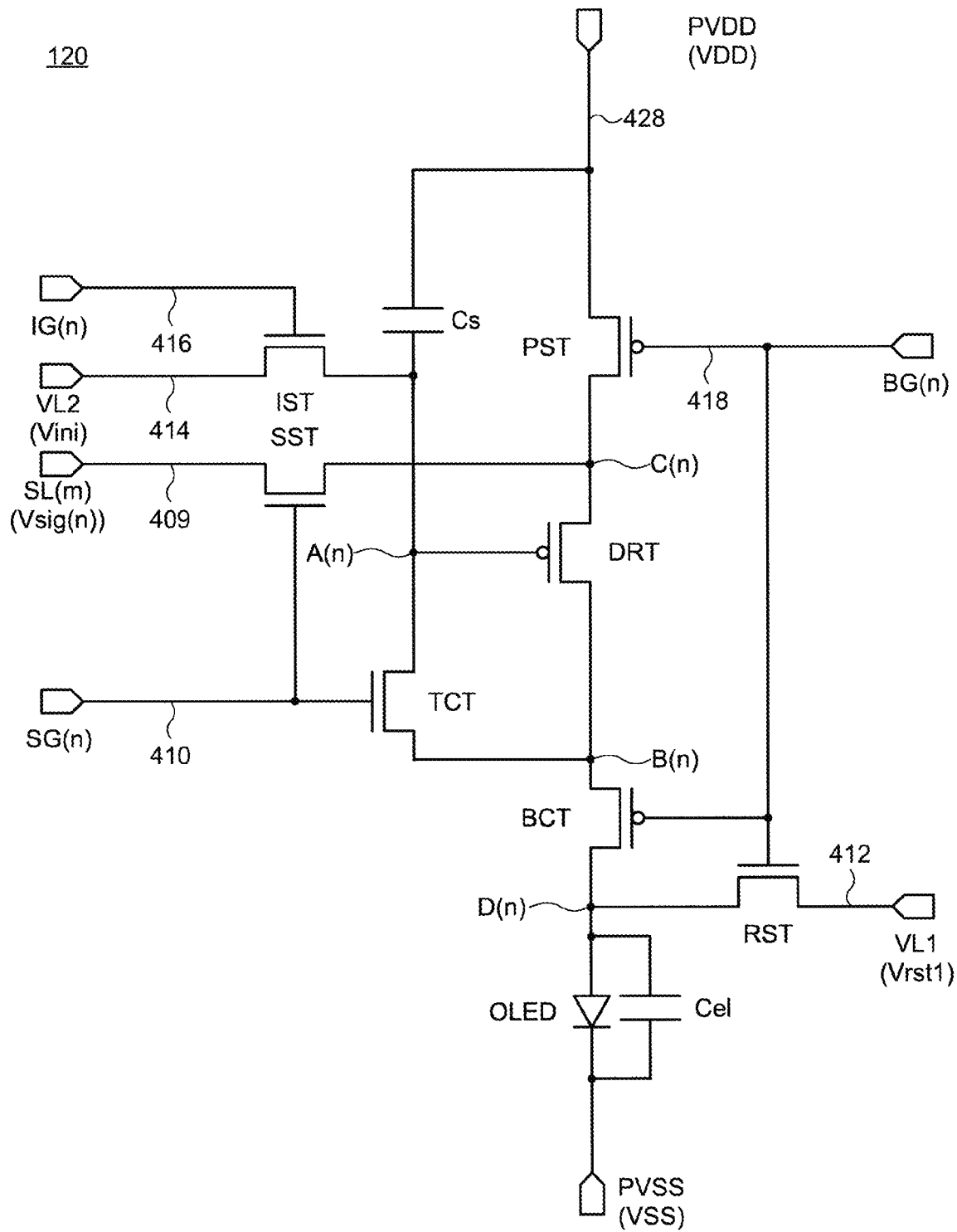
FIG. 15 is a circuit diagram of a pixel included in a display device related to one embodiment of the present invention.

In the present embodiment, the overall structure is the same as in FIG. 1 and FIG. 2. In the display device according to the present embodiment, an example is shown in which the circuit diagram of a pixel 120 shown in FIG. 2 is different from the circuit diagram shown in FIG. 3. FIG. 15 is a circuit diagram of a pixel 120 according to one embodiment of the present invention. A circuit diagram of pixels 120 of n rows and m columns shown in FIG. 2 is shown. The pixel 120 may also be a sub-pixel. Furthermore, the content explained in FIG. 1 and FIG. 2 is omitted here.

4-2. Pixel

Similar to the transistor shown in FIG. 3, each transistor shown in FIG. 15 can also include a group 14 element such as silicon or germanium or an oxide displaying semiconductor characteristics in a channel region. In the present embodiment, an n-channel type field effect transistor and a p-channel type field effect transistor are included. Furthermore, the circuit structure shown in FIG. 15 is an example and the present embodiment is not limited to this structure. For example, the polarity of each transistor may be reversed, the phase of a control signal may be inverted, and the arrangement of the storage capacitor element Cs may be between the first node and the drive power supply line PVDD. In an electric circuit such as a display device which includes pixels and an electronic circuit, it is possible to reduce power consumption of a circuit by using two types of field effect transistors, an n-channel type field effect transistor and a p-channel type field effect transistor. In addition, all of these transistors may be p-channel type field effect transistors. By using only a p-channel type field effect transistor, it is possible to simplify processing compared with the case where two types of field effect transistors, an n-channel type field effect transistor and a p-channel type field effect transistor are used. Furthermore, the channel region of these transistors can include various morphologies selected from single crystal, polycrystalline, microcrystalline or amorphous. For example, it is possible to include a low temperature polysilicon (LTPS) obtained by melting and recrystallizing amorphous silicon at a relatively low temperature.

As is shown in FIG. 15, the pixel 120 includes a drive transistor DRT, a selection transistor SST (first switch), an initialization transistor IST (second switch), a reset transistor RST (third switch), a light emitting control transistor BCT (fourth switch), a correction transistor TCT (fifth switch), a power supply transistor PST (sixth switch), a storage capacitor element Cs (capacitor element), a light emitting element OLED, and an additional capacitor Cel. Each of these transistors has a first electrode (gate electrode) and a pair of terminals (source electrode, drain electrode) comprising a second electrode and a third electrode. The storage capacitor element Cs includes a pair of terminals (first terminal, second terminal). The additional capacitor Cel includes a pair of terminals (first terminal, second terminal). The pair of terminals described above is also called a pair of electrodes. Furthermore, similar to FIG. 3, although FIG. 15 shows an example in which the additional capacitor Cel is arranged in parallel with the light emitting element OLED, the present invention is not limited to this structure. The additional capacitor Cel may also be a parasitic capacitance of the light emitting element OLED or may include a capacitor element arranged in parallel with the light emitting element OLED and a parasitic capacitance of the light emitting element OLED. A high potential VDD is supplied from the drive power supply line PVDD and a reference potential VSS is supplied from the reference potential line PVSS as a power supply for driving the light emitting element OLED. A potential Vcs of a capacitor signal VC can be made substantially the same as the high potential VDD which is supplied from the drive power supply line PVDD. Furthermore, a potential Vrst of the reset signal VL is smaller than the high potential VDD which is supplied from the drive power supply line PVDD and the potential Vcs of the capacitor signal VC, and can be made substantially the same as the reference potential VSS.

The drive transistor DRT plays a role of making a current to flow to the light emitting element OLED based on an input image signal which makes the light emitting element OLED emit light. The correction transistor TCT plays a role of making the gate electrode and the drain electrode of the drive transistor DRT conductive when correcting a threshold value of the drive transistor DRT. The selection transistor SST plays a role of supplying an image signal to the drive transistor DRT. The initialization transistor RST plays a role of supplying Vini to the gate electrode of the drive transistor DRT and resetting the gate of the drive transistor DRT. The power supply transistor PST controls connection and disconnection between the drive power supply line PVDD and the drive transistor DRT. The light emitting control transistor BCT controls connection and disconnection between the drive transistor DRT and the light emitting element OLED and between the drive transistor DRT and the additional capacitor Cel. That is, the light emitting control transistor BCT plays a role of controlling light emission and non-light emission of the light emitting element OLED. The reset transistor RST plays a role of supplying Vrst1 to a first terminal of the light emitting element OLED and to reset the source of the drive transistor DRT and the light emitting element OLED. In addition, the first terminal of the light emitting element OLED is a pixel electrode. The reset transistor RST supplies Vrst1 to the first terminal of the light emitting element OLED, and the display device 100 plays a role of displaying black. That is, the reset transistor RST has a role of controlling black insertion. The storage capacitor element Cs plays a role of maintaining a gate voltage of the drive transistor DRT. That is, the storage capacitor element Cs has a role of storing an input image signal. Specifically, the storage capacitor element Cs plays a role of storing a gradation level of an input image signal. The light emitting element OLED has diode characteristics. In addition, the light emitting element OLED includes a pixel electrode, the common electrode described above, and a light emitting layer (functional layer, organic layer) located between the pixel electrode and the common electrode. The additional capacitor Cel is a capacitor included in the light emitting element OLED. In one embodiment of the present invention, an input image signal may be stored by the additional capacitor Cel and the capacitor element Cs.

The gate electrode of the initialization transistor IST is electrically connected to an initialization control line 416. An initialization control signal IG (n) is supplied to the initialization control line 416. The to be conductive and non-conducting state of the initialization transistor IST is controlled by a signal which is supplied to the initialization control signal IG (n). When the signal which is supplied to the initialization control signal IG (n) is high, the initialization transistor IST is in a conducting state. When the signal which is supplied to the initialization control signal IG (n) is low, the initialization transistor IST is in a non-conducting state. The source electrode of the initialization transistor IST is electrically connected to a second reset voltage line 414. A reset signal VL is supplied to the second reset voltage line 414. The voltage of the second reset signal VL2 is Vini. The drain electrode of the initialization transistor IST is electrically connected to the gate electrode of the drive transistor DRT, the source electrode of the correction transistor TCT, and the first terminal of the storage capacitor element Cs. The second terminal of the storage capacitor element Cs is electrically connected to the drive power supply line PVDD. The drive power supply line PVDD is a drive power supply line 428.

The gate electrode of the selection transistor SST and the gate electrode of the correction transistor TCT are electrically connected to the scanning signal line 410. The scanning signal SG (n) is supplied to the scanning signal line. The conductive and non-conductive state of the selection transistor SST and the correction transistor TCT are controlled by a signal which is supplied to the scanning signal SG (n). When the signal which is supplied to the scanning signal SG (n) is high, the selection transistor SST and the correction transistor TCT are in a conducting state. When the signal which is supplied to the scanning signal SG (n) is low, the selection transistor SST and the correction transistor TCT are in a non-conducting state. The source electrode of the selection transistor SST is electrically connected to an image signal line 409. An image signal SL (m) is supplied to the image signal line 409. The drain electrode of the selection transistor SST is electrically connected to the drain electrode of the power supply transistor PST and the source electrode of the drive transistor DRT. The source electrode of the power transistor PST is electrically connected to the drive power supply line PVDD.

The gate electrode of the power supply transistor PST, the gate electrode of the light emitting control transistor BCT, and the gate electrode of the reset transistor RST are electrically connected to the light emitting control line 418. The light emitting control signal BG (n) is supplied to the light emitting control line 418. The conducting and non-conducting state of the power supply transistor PST, the light emitting control transistor BCT and the reset transistor RST are controlled by a signal supplied to the light emitting control signal BG (n). When the signal which is supplied to the light emitting control signal BG (n) is low, the power supply transistor PST, the light emitting control transistor BCT and the reset transistor RST are in a non-conducting state. When the signal which is supplied to the light emitting control signal BG (n) is high, the power supply transistor PST, the light emitting control transistor BCT and the reset transistor RST are in a conducting state.

The drain electrode of the drive transistor DRT is electrically connected to the drain electrode of the correction transistor TCT and the source electrode of the light emitting control transistor BCT. The drain electrode of the light emitting control transistor BCT is electrically connected to the drain electrode of the reset transistor RST, the first terminal of the light emitting element OLED and the first terminal of the additional capacitor Cel. The gate electrode of the reset transistor RST is electrically connected to the first reset voltage line 412. The first reset voltage line 412 is supplied with the first reset signal VL1. Here, the voltage of the first reset signal VL1 is Vrst1.

In the pixel 120 shown in FIG. 15, similar to the pixel 120 shown in FIG. 3, the potential of Vini is higher than the potential of Vrst, and the potential difference is larger than a threshold voltage of the drive transistor DRT. In this way, because of the operations in the time period T1, the drive transistor DRT is reset from the state based on the previous image signal and forcibly put into an ON state.

The second terminal of the light emitting element OLED and the second terminal of the additional capacitor Cel are electrically connected to the reference voltage line PVSS.

The drain electrode of the initialization transistor IST, the gate electrode of the drive transistor DRT, the source electrode of the correction transistor TCT and the first terminal of the storage capacitor element Cs are electrically connected to the first node A (n). The drain electrode of the drive transistor DRT, the drain electrode of the correction transistor TCT and the source electrode of the light emitting control transistor BCT are electrically connected to the second node B (n). The drain electrode of the selection transistor SST, the drain electrode of the power supply transistor PST and the source electrode of the drive transistor DRT are electrically connected to the third node C (n). The drain electrode of the light emitting control transistor BCT and the drain electrode of the reset transistor RST are electrically connected to a fourth node D (n).

Since the first reset voltage line 412 supplies the common voltage Vrst1 to each pixel, it may also be called a second common electrode in the present specification. Since the second reset voltage line 414 supplies the common voltage Vini to each pixel, it may also be called a third common electrode in the present specification.

4-3. Driving Method

Figure 16:
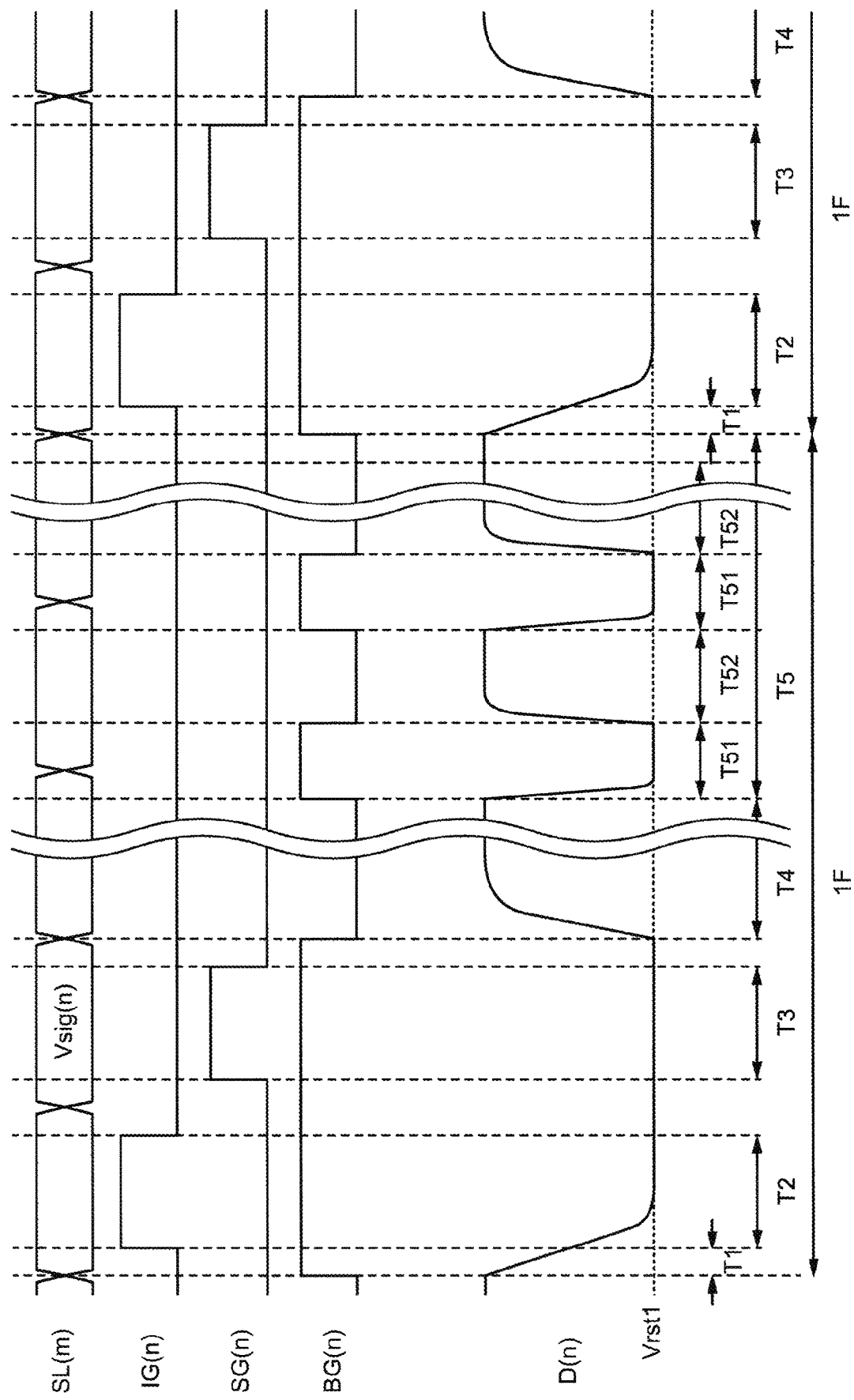
FIG. 16 is a timing chart of the pixel shown in FIG. 15.

A method of driving a display device according to one embodiment of the present invention is explained using FIG. 16 to FIG. 22. In the explanation using FIG. 16 to FIG. 22, explanations similar to the content explained in FIG. 1 to FIG. 15 may be omitted. FIG. 16 is a timing chart of the pixel shown in FIG. 15.

Figure 17:
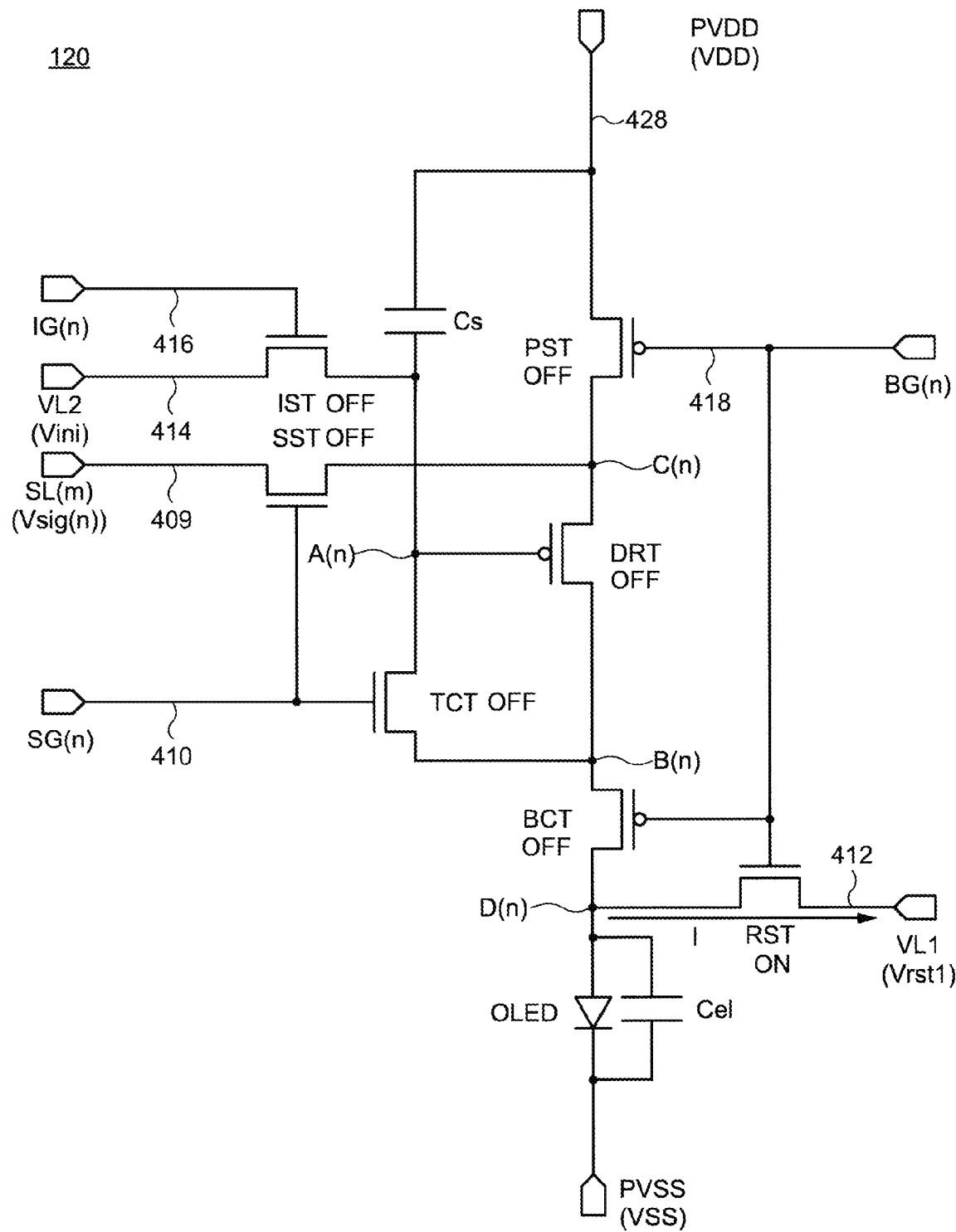
FIG. 17 is a schematic diagram showing an operation state of a pixel in the timing chart shown in FIG. 16.

FIG. 17 shows a state of pixels in the nth row and the mth column in the time period T1 of the timing chart shown in FIG. 16. In the time period T1, a low voltage is supplied to the initialization control signal IG (n) and the scanning signal SG (n). In this way, the initialization transistor IST, the selection transistor SST, and the correction transistor TCT are in a non-conducting state. In addition, in the time period T1, a high voltage is supplied to the light emitting control signal BG (n). In this way, the power supply transistor PST and the light emitting control transistor BCT are in a non-conducting state. The reset transistor RST is in a conducting state. Furthermore, although the drive transistor DRT is in a non-conducting state, it may also be in a conducting state. At this time, the drive transistor DRT remains in a state based on a signal previously input to the gate. In this way, Vrst1 which is supplied to the first reset signal VL1 is supplied to the drain electrode of the reset transistor RST, the drain electrode of the light emitting control transistor BCT, the first terminal (pixel electrode) of the light emitting element OLED and the first terminal of the additional capacitor Cel. In this way, a current does not flow from the drive power supply line 428 to the reference voltage line PVSS. Therefore, the light emitting element OLED is in a non-light emitting state. The voltage of the node D (n) is Vrst1.

Figure 18:
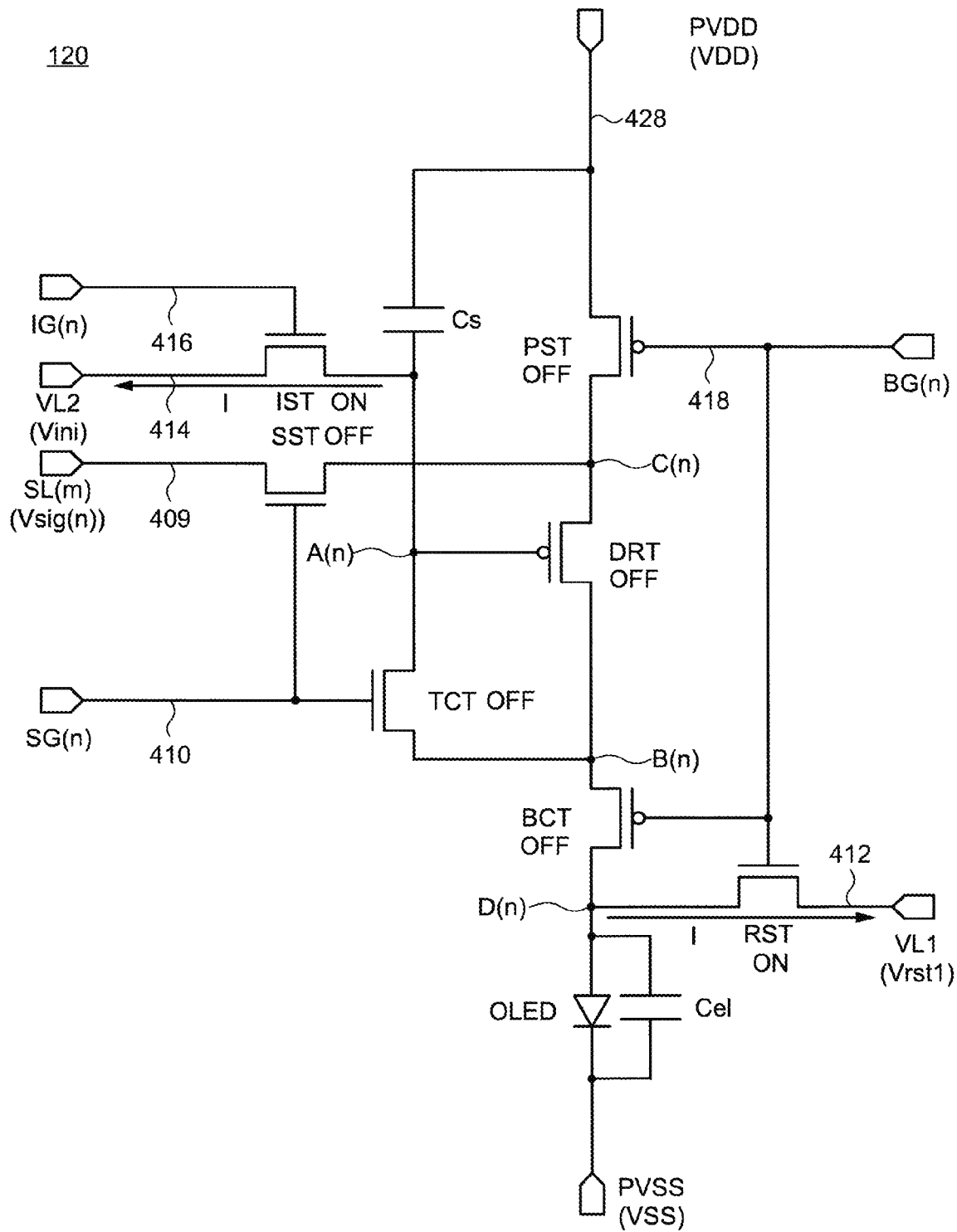
FIG. 18 is a schematic diagram showing an operation state of a pixel in the timing chart shown in FIG. 16.

FIG. 18 shows a state of pixels in the nth row and the mth column in the time period T2 of the timing chart shown in FIG. 16. In the time period T2, the voltage which is supplied to the initialization control signal IG (n) changes from a low voltage to a high voltage. In this way, the initialization transistor IST is in a conducting state. Therefore, Vini which is supplied to the second reset signal VL2 is supplied to the gate electrode of the drive transistor DRT, the source electrode of the correction transistor TCT, and the first terminal of the storage capacitor element Cs. Since the gate electrode of the drive transistor DRT, the source electrode of the correction transistor TCT, and the first terminal of the storage capacitor element Cs are electrically connected to the node A (n), the voltage of the node A (n) is also Vini. At this time, the voltage (Vini) of the gate electrode of the drive transistor DRT is smaller than the voltage of the drain electrode of the drive transistor DRT and the voltage of the source electrode of the drive transistor DRT. In this way, the drive transistor DRT is in a conducting state for a short period of time. Next, the voltage of the node C (n) becomes Vini-Vth so that the drive transistor DRT is in a non-conducting state. Furthermore, Vth is the threshold voltage of the drive transistor DRT. The voltage of the node A (n) is Vini. The voltage of the node D (n) is Vres1. The voltage of the node D (n) is maintained at Vrst1. The light emitting element OLED is in a non-light state also in the time period T2. In addition, since a pixel electrode of the light emitting element OLED is supplied with Vrst1, the display device displays black.

Figure 19:
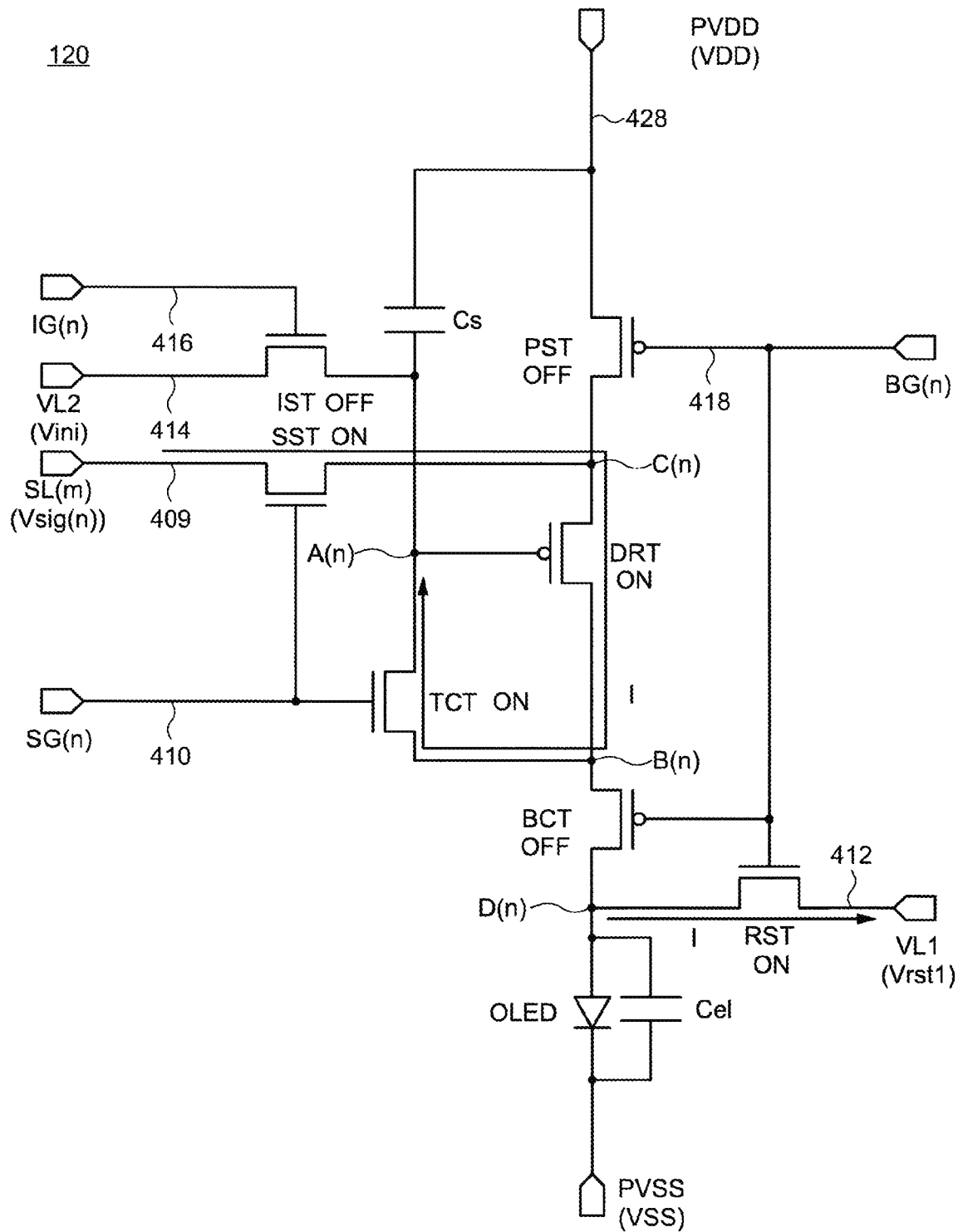
FIG. 19 is a schematic diagram showing an operation state of a pixel in the timing chart shown in FIG. 16.

FIG. 19 shows a state of pixels in the nth row and the mth column in the time period T3 of the timing chart shown in FIG. 16. In the time period T2 to the time period T3, the voltage which is supplied to the initialization control signal IG (n) changes from a high voltage to a low voltage. In this way, the initialization transistor IST is in a non-conducting state. In addition, from the time period T2 to the time period T3, the voltage which is supplied to the scanning signal SG (n) changes from a low voltage to a high voltage. In this way, the selection transistor SST and the correction transistor TCT are in a conducting state. Therefore, the gate electrode and the drain electrode of the drive transistor DRT are short-circuited. When the voltage Vsig (n) of the video signal SL (m) is supplied to the image signal line 409, the drain electrode of the selection transistor SST, the drain electrode of the power supply transistor PST, and the source electrode of the drive transistor DRT become Vsig (n). Since the drain electrode of the selection transistor SST, the drain electrode of the power supply transistor PST, and the source electrode of the drive transistor DRT are electrically connected to the node C (n), the voltage of the node C (n) also becomes Vsig (n). In the drive transistor DRT, the voltage of the source electrode is Vsig (n) which is larger than the voltage of the short-circuited gate electrode and drain electrode. In this way, the drive transistor DRT is in a conducting state. Therefore, the gate electrode and the drain electrode of the drive transistor DRT, the source electrode and the drain electrode of the correction transistor TCT, the first terminal of the storage capacitor element Cs, and the drain electrode of the initialization transistor IST are also supplied with Vsig (N) from the image signal line 409. Since the gate electrode of the drive transistor DRT, the source electrode of the correction transistor TCT, the first terminal of the storage capacitor element Cs, and the drain electrode of the initialization transistor IST are electrically connected to the node A (n), the voltage of the node A (n) is also Vsig (n). Next, the voltage of the node A (n) becomes Vsig (n)-Vth, and the drive transistor DRT is in a non-conducting state. Finally, in the time period T3, the voltage VA4 of the node A (n) is Vsig (n)-Vth. In addition, the voltage of the node C (n) is Vsig (n). In this way, it is possible to store a charge corresponding to the threshold voltage of the drive transistor DRT between the node A (n) and the drive power supply line PVDD, that is, the storage capacitor element Csx. Therefore, the display device of the present invention can correct a threshold value of the drive transistor DRT in the time period T3. Therefore, it is possible to suppress unevenness in luminosity due to variations in image signals. Following this, the voltage of the node A (n) is maintained at Vsig (n)-Vth and the voltage of the node C (n) is maintained at Vsig (n) also in the time period between the time period T3 and the time period T4. Furthermore, the light emitting element OLED also does not emit light in the time period T3. In addition, since the pixel electrode of the light emitting element OLED is supplied with Vrst1, the display device displays black.

Figure 20:
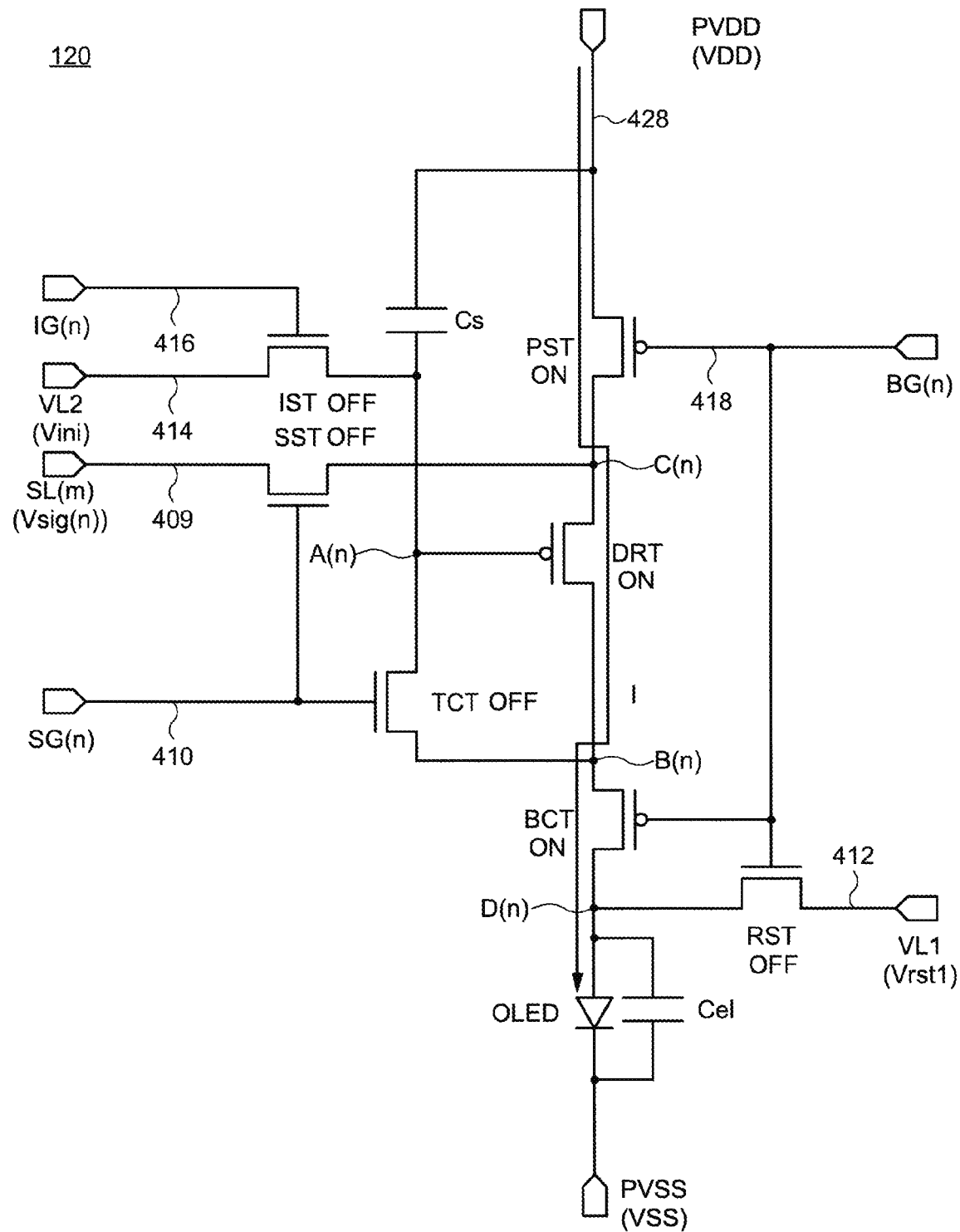
FIG. 20 is a schematic diagram showing an operation state of a pixel in the timing chart shown in FIG. 16.

FIG. 20 shows a state of the pixels in the nth row and the mth column in the time period T4 of the timing chart shown in FIG. 16. Between the time period T3 and the time period T4, the voltage which is supplied to the scanning signal SG (n) changes from a high voltage to a low voltage. In this way, the selection transistor SST and the correction transistor TCT are in a non-conducting state. In addition, in the time period T4, the voltage which is supplied to the light emitting control signal BG (n) changes from a high voltage to a low voltage. In this way, the power supply transistor PST and the light emitting control transistor BCT are in a conducting state. Since the source electrode of the power supply transistor PST is connected to the drive power supply line 428, the voltage of the node C (n) becomes the voltage VDD which is supplied to the drive power supply line 428. The voltage of the source electrode of the drive transistor DRT becomes VDD. In this way, the drive transistor DRT flows a current according to the voltage Vsig (n)-Vth of the gate electrode of the drive transistor DRT. Therefore, a current flows from the drive power supply line 428 to the reference voltage line PVSS, and the light emitting element OLED emits light.

Figure 21:
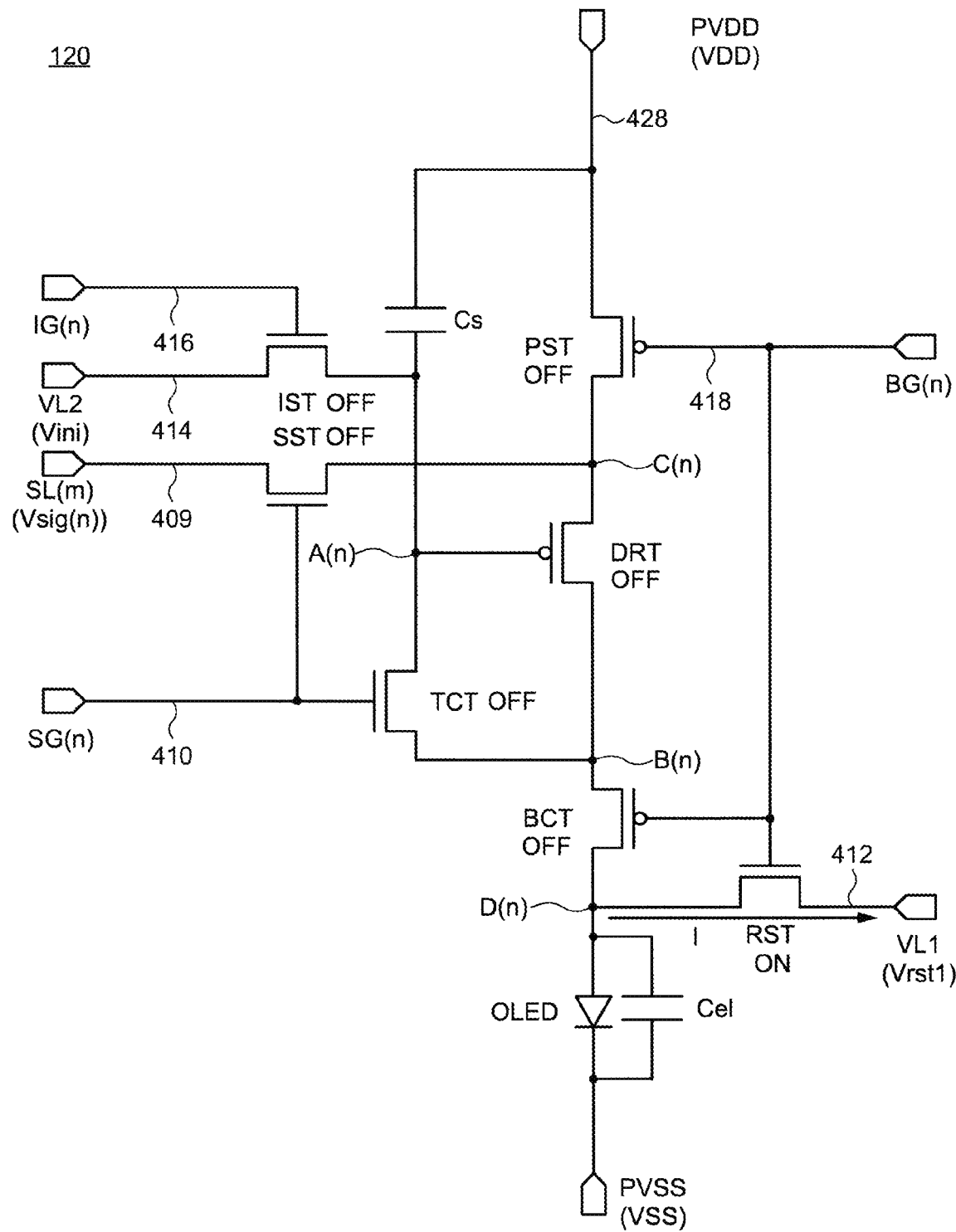
FIG. 21 is a schematic diagram showing an operation state of a pixel in the timing chart shown in FIG. 16.
Figure 22:
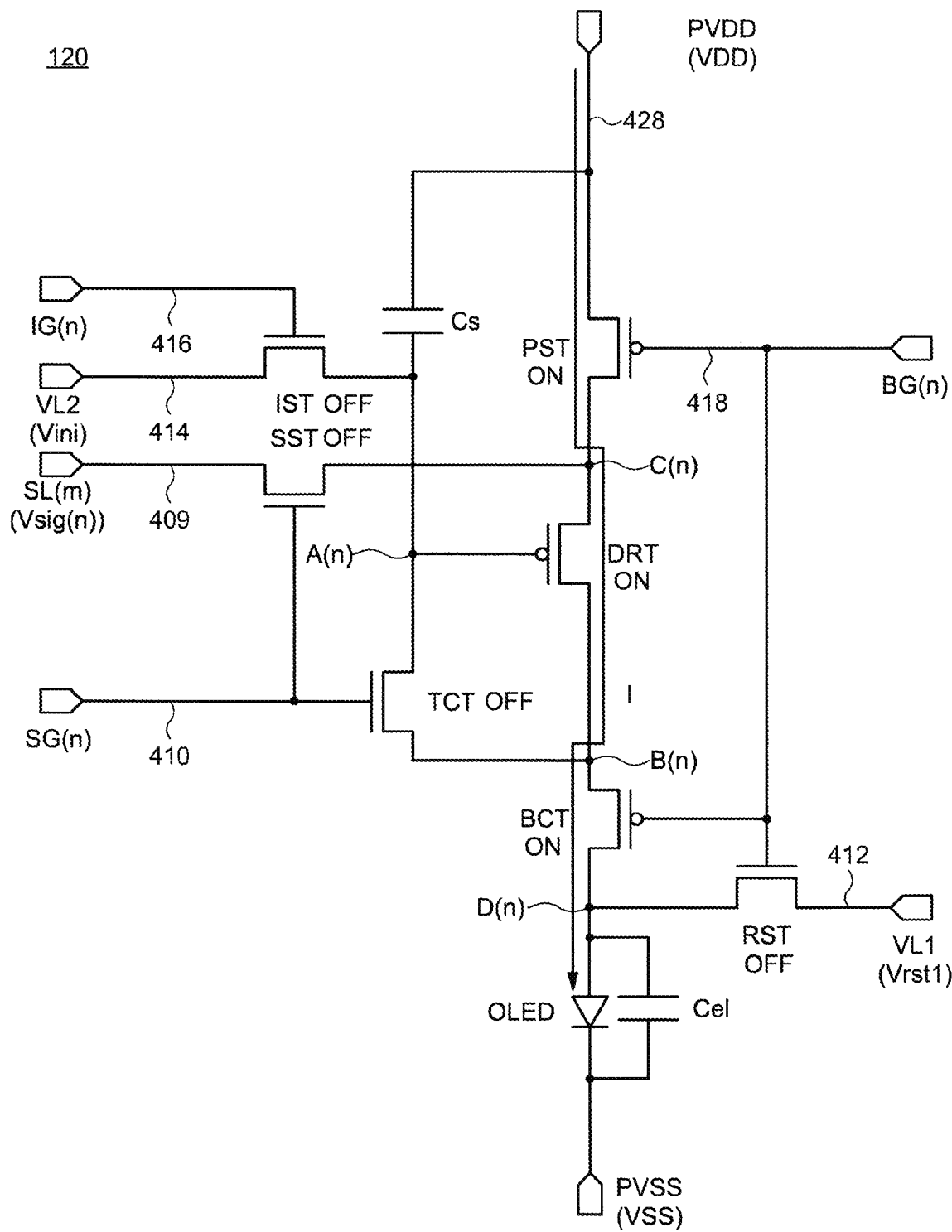
FIG. 22 is a schematic diagram showing an operation state of a pixel in the timing chart shown in FIG. 16.

FIG. 21 and FIG. 22 show a state of pixels in the nth row and the mth column in the time period T5 of the timing chart shown in FIG. 16. In the display device according to the present embodiment, similar to the explanation of FIG. 10 and FIG. 11, the time period T5 includes a time period in which black insertion is performed at intervals of 1/60 seconds or less. FIG. 21 shows a state of a pixel in the nth row and the mth column in the time period T51 in the timing chart shown in FIG. 16. Since FIG. 21 has the same operations as the beginning of the time period T1 explained in FIG. 17, a detailed explanation is omitted. In addition, FIG. 22 shows a state of a pixel in the nth row and the mth column in the time period T52 in the timing chart shown in FIG. 16. Since FIG. 22 has the same operations as in the time period T4 explained in FIG. 20, a detailed explanation is omitted. In the time period T5, it is possible to supply Vrst1 to a pixel electrode of a light emitting element OLED by making the reset transistor RST conductive. That is, the display device 100 can display black. Black insertion consists of, for example, a one-time black display among 60 Hz in a non-light emitting period and 59 times is black insertion.

A time period including the time periods shown in FIG. 16 to FIG. 22 is set as 1 frame (1F), and an image of one screen is switched for every 1F.

As was explained above, the display device according to one embodiment of the present invention simultaneously controls the reset transistor RST, the light emitting control transistor BCT and the power supply transistor PST using the light emitting control signal BG (n). In the display device according to the present embodiment, it is possible to adjust the voltage which is supplied to a pixel electrode of the light emitting element at the time of resetting (initialization) the drive transistor DRT and the voltage which is supplied to a pixel electrode of the light emitting element at the time of black insertion. In this way, it is possible to adjust a change in the voltage which is supplied to a pixel electrode at the time of transition from a non-light emitting time period to a light emitting time period, and a change in the voltage which is supplied to a pixel electrode at the time of transition from black insertion to a light emitting time period by using the display device of the present embodiment or the driving method of the display device of the present embodiment. Therefore, by using the display device in the present embodiment or the driving method of the display device in one embodiment of the present invention, it is possible to reduce flicker in display.

Therefore, it is possible to provide a display device in which a decrease in image quality of a displayed image can be reduced by using a display device according to one embodiment of the present invention or a driving method of a display device according to one embodiment of the present invention.

5. Fourth Embodiment

In the present embodiment, another structure of a display device according to one embodiment of the present invention is explained. Furthermore, an explanation of a structure which is similar to the first to third embodiments may be omitted.

Figure 23:
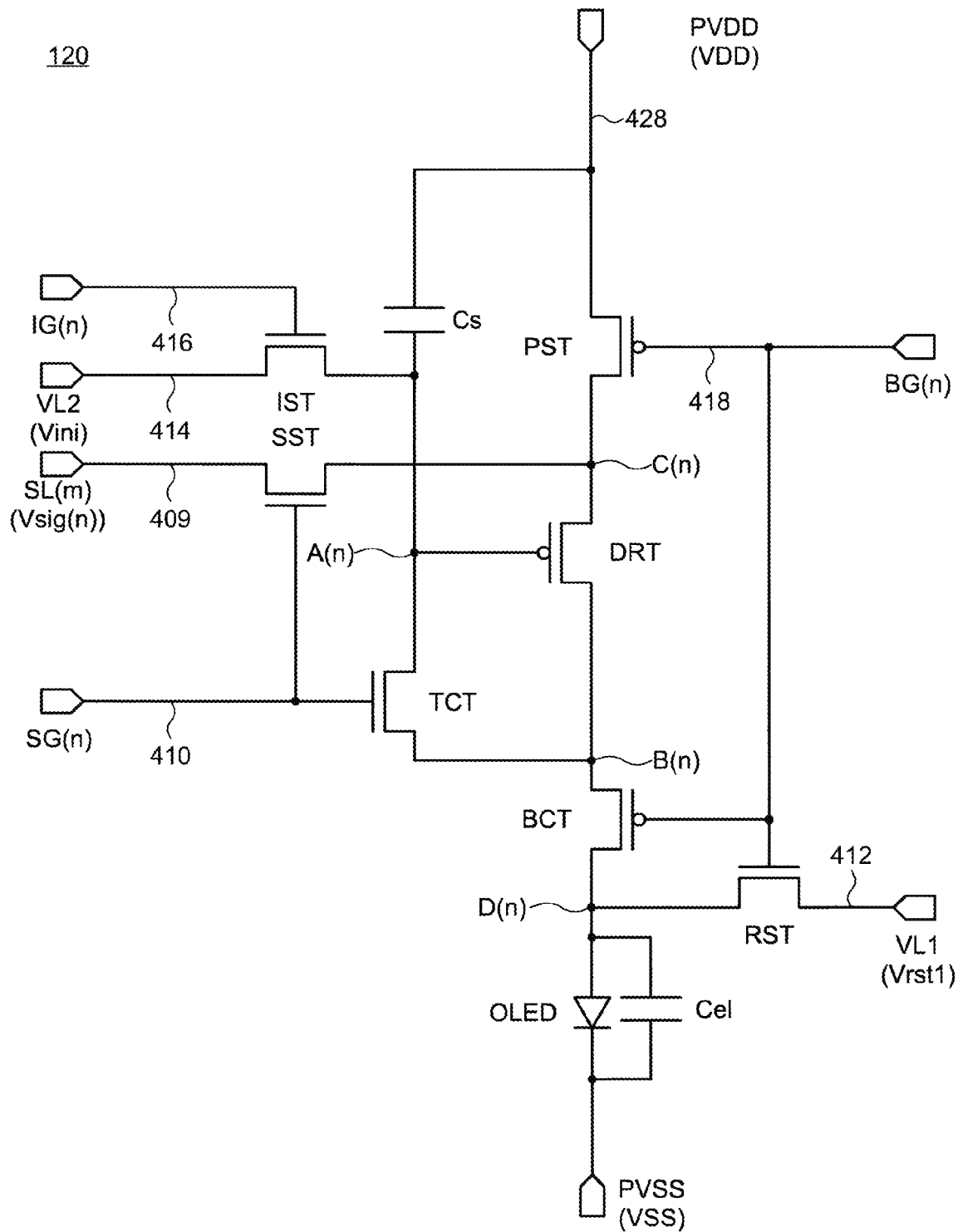
FIG. 23 is a circuit diagram of a pixel included in a display device related to one embodiment of the present invention.

FIG. 23 is a circuit diagram of a pixel 120 according to one embodiment of the present invention. A circuit diagram of the pixel 120 of n rows and m columns shown in FIG. 2 is shown. The pixel 120 may also be a sub-pixel. In FIG. 23, the voltage of the first reset signal is selected from one of two voltages Vrst1 and Vrst2 which is different compared to the circuit diagram shown in FIG. 15. Since the other points are the same as those explained in FIG. 15, an explanation here is omitted.

In addition, it is possible to apply the circuit diagram of the voltage selection circuit shown in FIG. 13 to a circuit for selecting any one of Vrst1 and Vrst2. In the present embodiment, an explanation of FIG. 13 is omitted. By adopting the structure shown in FIG. 13, it is possible to reduce the layout area and the mounting area of the voltage selection circuit without reducing the number of elements. In addition, by making each of the two switches which form the voltage selection circuit an analog switch (also called a transmission gate) comprised from an n-channel type field effect transistor and a p-channel type field effect transistor, it is possible to reliably transmit and block an analog voltage of Vrst1 and Vrst2.

Figure 24:
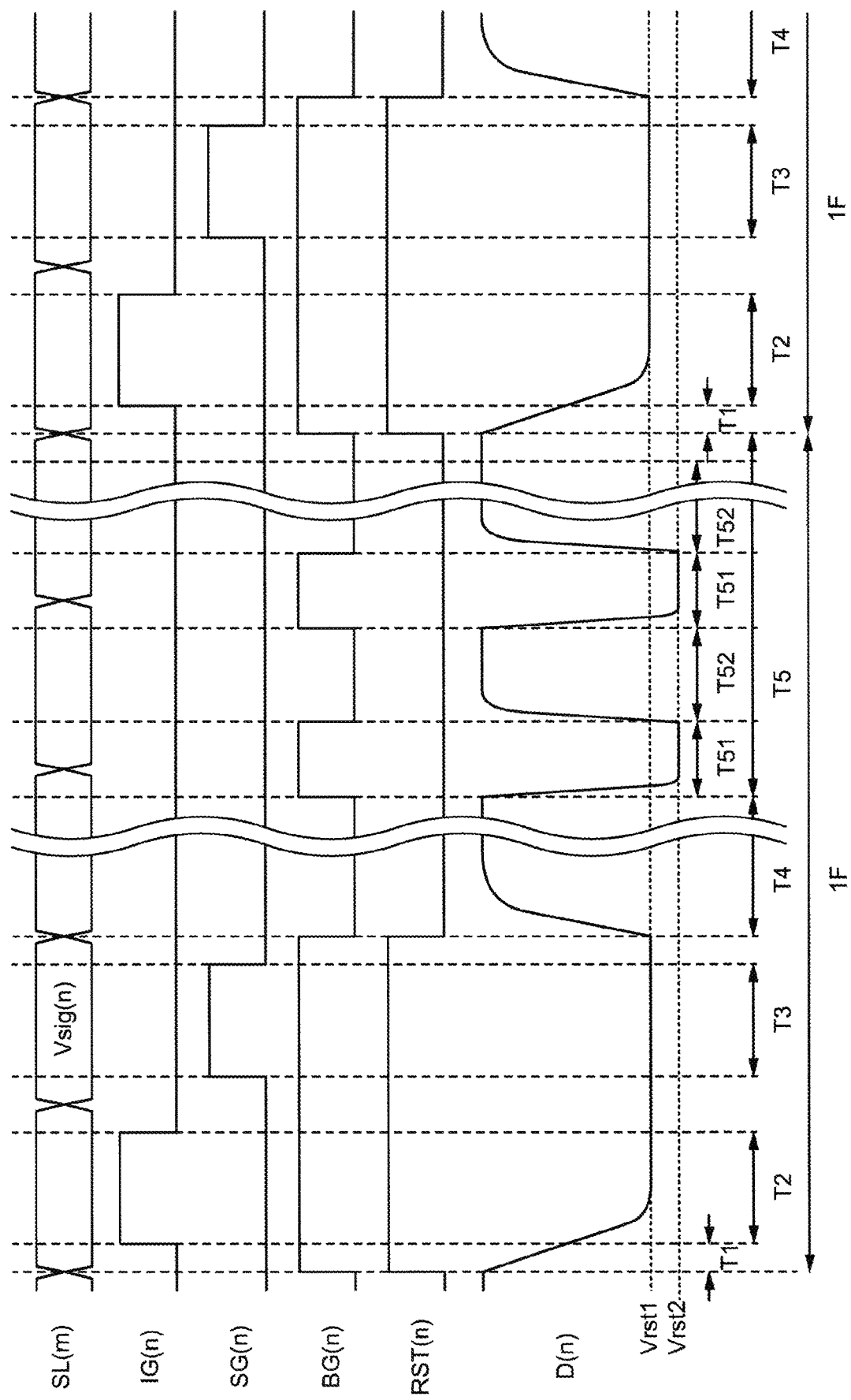
FIG. 24 is a timing chart of the pixel shown in FIG. 23.

FIG. 24 is a timing chart of the pixel shown in FIG. 23. FIG. 24 is different compared to the timing chart shown in FIG. 16 in that the voltage supplied to the node A (n) which is electrically connected to the pixel electrode of the light emitting element OLED is different in the time period T1 and the time period T5. Specifically, Vrst1 is supplied during the non-light emitting time period such as the time period T1. Vrst2 is supplied in black insertion in the time period T5. Since the other points are the same as those explained in FIG. 16, an explanation here is omitted.

In one embodiment of the present invention, apart from one of Vrst1 and Vrst2 being selected as the first reset signal VL1 by a voltage selection circuit, the state of a pixel is the same as the state of the pixel explained in FIG. 17 to FIG. 22. In this way, an explanation of the state of each pixel in the timing chart of FIG. 24 is omitted here.

As was explained above, the display device according to one embodiment of the present invention simultaneously controls the reset transistor RST, the light emitting control transistor BCT and the power supply transistor PST using the light emitting control signal BG (n). In the display device according to one embodiment of the present invention, it is possible to finely adjust a voltage which is supplied to a pixel electrode of a light emitting element at the time of black insertion by arranging a voltage selection circuit. In this way. it is possible to more precisely the voltage which is supplied to the pixel electrode of the light emitting element at the time of resetting (initialization) the drive transistor DRT and the voltage which is supplied to the pixel electrode of the light emitting element at the time of black insertion. That is, it is possible to further reduce flicker in display by using the display device in one embodiment of the invention or the driving method of the display device in one embodiment of the present invention.

Therefore, it is possible to provide a display device in which a decrease in image quality of a displayed image can be reduced by using a display device according to one embodiment of the present invention or a driving method of a display device according to one embodiment of the present invention.

6. Fifth Embodiment

In the present embodiment, a stacked structure of a display device according to one embodiment of the present invention is explained. Furthermore, an explanation of structures similar to the first to fourth embodiments may be omitted.

FIG. 25 is a schematic cross-sectional diagram of a display device according to one embodiment of the present invention.

The display device 100 is arranged with a semiconductor layer 141 on the upper surface of a substrate 502 interposed by an underlying film 501 which has an arbitrary structure.

A drive transistor 434 is arranged on the upper side of the underlying film 501. The drive transistor 434 includes a semiconductor layer 141, a gate insulating film 144, a gate electrode 146 and a source or drain electrode 154. The source or drain electrode 154 and an auxiliary capacitor element (not shown in the diagram) may be formed by injecting impurities into the semiconductor layer 141. The gate electrode 146 overlaps a semiconductor layer 142 interposed by the gate insulating film 144. The region where the semiconductor layer 141 and the gate electrode 146 overlap is a channel region of the drive transistor 434. The semiconductor layer 142 may also include a source and a drain region so as to sandwich the channel region. An insulating film 108 can be arranged above the gate electrode 146.

The transistor is shown In FIG. 25 as a top gate type transistor. There is no limitation to the structure of the transistor 140. The structure of the transistor 140 may be, for example, a bottom gate type transistor, a multi-gate type transistor including a plurality of gate electrodes 146, or a dual gate type transistor including a structure in which the semiconductor layer 142 is sandwiched vertically between two gate electrodes 146. In addition, an example is shown in FIG. 25 in which one pixel 102 has three sub-pixels, a sub-pixel 130, a sub-pixel 132 and a sub-pixel 134. In addition, an example is shown in FIG. 25 in which one drive transistor 434 is arranged for each sub-pixel 130, each sub-pixel 132 and each sub-pixel 134. Each sub-pixel 130, each sub-pixel 132 and each sub-pixel 134 may further include a semiconductor element such as a plurality of transistors and a capacitor element.

An insulating film 108 is arranged above the transistor. The insulating film 108 has the function of absorbing concave/convex parts caused by transistors and other semiconductor elements and to provide a flat surface. An organic compound material selected from acrylic or polyimide and the like which have excellent film surface flatness can be used as the insulating film 108.

A drive power supply line 428 is arranged above the insulating film 108. A first reset voltage line 412 is also arranged in the same layer as the drive power supply line 428. Furthermore, the drive power supply line 428 and the gate electrode 146 overlap. The storage capacitor element 438 is formed by the gate electrode 146, the insulating film 108 and the drive power supply line 428. At this time, a first terminal of the storage capacitor element 438 is the gate electrode 146, and a second terminal of the storage capacitor element 438 is a part of the drive power supply line 428.

An insulating film 114 is further arranged. Similar to the insulating film 108, the insulating film 114 has a function of absorbing concave and convex parts caused by transistors and other semiconductor elements and to provide a flat surface. Similar to the insulating film 108, an organic compound material selected from acrylic or polyimide and the like which have excellent film surface flatness can be used for the gate insulating film 144.

An opening 152_1 which reaches the semiconductor layer 142 is arranged in the gate insulating film 144, the insulating film 108 and the insulating film 114. At the same time, an opening (not shown in the diagram) which reaches the gate electrode 146 is also arranged in the insulating film 108 and the insulating film 114. An opening (not shown in the diagram) which reaches the first reset voltage line 412 is also arranged in the insulating film 108 and the insulating film 114.

Next, a conductive layer 440_3 arranged in the same layer as the image signal line 409, the drive power supply line 428 and the image signal line 409 is arranged. The conductive layer 440_3 is electrically connected to the semiconductor layer 142 or the source or drain electrode 154 via the opening 152_1. First terminal wiring 210 is also arranged in the same layer as the image signal line 409. Although not shown in the diagram, a first terminal wiring 210 may also be formed to exist in the same layer as the gate electrode 146.

Next, an insulating film 148 is arranged. In addition, an inorganic insulating film 150 may be formed above the insulating film 148. The inorganic insulating film 150 has a function for protecting a semiconductor element such as a transistor. In addition, a pixel electrode 162 of the light emitting element 160 described below may be formed in the lower layer of the inorganic insulating film 150, and electrodes (not shown in the diagram) formed so as to sandwich the inorganic insulating film 150 may be formed in the lower layer of the inorganic insulating film 150. At this time, a capacitor can be formed between the pixel electrode 162 and the electrodes (not shown in the diagram) formed so as to sandwich the inorganic insulating film 150, interposed by the inorganic insulating film 150 therebetween.

A plurality of openings is arranged in the insulating film 148 and the inorganic insulating film 150. One of these openings is an opening 190. The opening 190 electrically connects the pixel electrode 162 of the light emitting element 160 described later and the conductive layer 440_3, and wiring arranged in the same layer as the conductive layer 440_3. One of the openings is a contact hole 208 which is used for electrical connection between the first wiring 206 and the first terminal wiring 210. One of the openings is an opening 156 which is arranged to expose a part of the first terminal wiring 210. The first terminal wiring 210 which is exposed at the opening 156 is connected to a connector 512 by, for example, an anisotropic conductive film 252 or the like.

A light emitting element 160 is formed above the insulating film 114 and the inorganic insulating film 150. The light emitting element 160 includes the pixel electrode 162, the functional layer 164 and the common electrode 166. More specifically, the pixel electrode 162 covers the opening 190 and is arranged to be electrically connected to the conductive layer 440_3. In this way, a current is supplied to the light emitting element 160 via the drive transistor DRT. An insulating film 168 is arranged to cover an end part of the pixel electrode 162. The insulating film 168 is a partition wall. It is possible to prevent disconnection of the functional layer 164 and the common electrode 166 arranged above by covering the end part of the pixel electrode 162 with the partition wall. The functional layer 164 is arranged to cover the pixel electrode 162 and the partition wall, and the common electrode 166 is arranged above. Carriers are injected into the functional layer 164 from the pixel electrode 162 and the common electrode 166, and carrier recombination occurs within the functional layer 164. In this way, light emitting molecules within the functional layer 164 reach an excited state, and light emission is obtained via a process whereby the molecules relax to a ground state. Therefore, a region where the pixel electrode 162 and the functional layer 164 contact is a light emitting region in each of the sub-pixel 130, each sub-pixel 132 and each sub-pixel 134.

It is possible to appropriately select the structure of the functional layer 164 can be formed by combining, for example, a carrier injection layer, a carrier transport layer, a light emitting layer, a carrier blocking layer and an exciton blocking layer. An example is shown in FIG. 25 in which the functional layer 164 has three layers 170, 176 and 174. In this case, for example layer it is possible to set the layer 170 as a carrier (hole) injection and transport layer, the layer 176 as a light emitting layer, and the layer 174 as a carrier (electron) injection and transport layer. The layer 176 which is a light emitting layer can be formed including different materials for the sub-pixel 130, each sub-pixel 132 and each sub-pixel 134. In this case, the other layers 170 and 174 may be formed over the sub-pixel 130, each sub-pixel 132, each sub-pixel 134 and the partition so as to be shared by the sub-pixel 130, each sub-pixel 132 and each sub-pixel 134. By appropriately selecting the material to be used for the layer 176, it is possible to obtain different light emitting colors for the sub-pixel 130, each sub-pixel 132 and each sub-pixel 134. Alternatively, the structure of the layer 174 may also set to be the same between the sub-pixel 130, each sub-pixel 132 and each sub-pixel 134. In this case, the layer 174 may be formed over the sub-pixel 130, each sub-pixel 132, each sub-pixel 134 and the partition wall so as to be shared by the sub-pixel 130, each sub-pixel 132 and each sub-pixel 134. In this type of structure, since the same light emitting color are output from the layer 176 of each sub-pixel 130, each sub-pixel 132, and each sub-pixel 134, for example, the layer 176 can be formed to emit white light, and various colors (for example, red, green, and blue) may be extracted from the sub-pixel 130, each sub-pixel 132, and each sub-pixel 134 respectively.

Furthermore, the display device 100 may further include connection electrodes 234 and 236 which cover the contact hole 208 and the opening 156 and contact the first terminal wiring 210. These connection electrodes 234, 236 can exist in the same layer as the pixel electrode 162. It is possible to reduce damage to the first terminal wiring 210 in the manufacturing process of the display device 100 by forming the connection electrodes 234 and 236, and it is possible to realize an electrical connection with low contact resistance.

A sealing film 180 is arranged above the light emitting element 160. The sealing film is also called a passivation film. The sealing film 180 has a function for preventing impurities (water, oxygen and the like) from entering the light emitting element 160 and the transistor from the exterior. As is shown in FIG. 25, the sealing film 180 can include three layers (layer 182, layer 184, layer 186). It is possible to use an inorganic film containing an inorganic compound for the layers 182 and 186. The layer 182 is also called a first inorganic film 182. The layer 186 is also called a second inorganic film 186. On the other hand, it is possible to use a film (organic film) including an organic compound selected from acrylic and polyimide or the like as the layer 184 between the first inorganic film 182 and the second inorganic film 186. The layer 184 is also called an organic film 184. The organic film 184 can be formed to absorb concave and convex parts caused by the light emitting element 160 and the partition wall and to provide a flat surface. As a result, the thickness of the organic film 184 can be made relatively large.

Furthermore, it is preferred that the first inorganic film 182 and the second inorganic film 186 are formed to cover at least the display region 504. In addition, it is preferred that the first inorganic film 182 and the second inorganic film 186 are formed so as not to overlap the contact hole 208 and the opening 156. In this way, an electrical connection with low contact resistance is possible between the first terminal wiring 210 and the connector 512 or the first wiring 206. Furthermore, it is preferred that the first inorganic film 182 and the second inorganic film 186 are in direct contact with each other in the periphery of the display region 504 (see the region surrounded by the circle 188). In this way, since it is possible to seal the organic film 184 having a higher hydrophilicity compared with the first inorganic film 182 and the second inorganic film 186 using the first inorganic film 182 and the second inorganic film 186, it is possible to more effectively prevent impurities from entering from the exterior and prevent impurities diffusing within the display region 504.

A cover film 268 is arranged above the second inorganic film 186. The first terminal wiring 210 is arranged to be in contact with a region (region A) where the insulating film 114, the insulating film 108, the gate insulating film 144, and the underlying film 501 are opened, and the substrate 502. The region A is a region where the display device 100 can bend. The cover film 268 protects the surface of the display device 100 up to the region where it can bend. In addition, a cover film 269 may also be arranged under the underlying film 501. The cover film 269 protects the underlying film 501 from being damaged and also protects the rear surface of the display device 100. Furthermore, the cover film 268 and the cover film 269 are not necessary and as long as the cover film 268 itself has properties which here sufficiently flexible towards bending, it may be extended to a region where it can bend.

The display device according to one embodiment of the present invention can include the stacked structure described above. Flicker is reduced by including the stacked structure described above in the display device according to one embodiment of the present invention. Therefore, it is possible to provide a display device in which a decrease in image quality of a displayed image can be reduced by including the stacked structure described above in the display device according to one embodiment of the present invention.

Each embodiment described above as embodiments of the present invention can be implemented in combination as appropriate as long as they do not contradict each other. In addition, those skilled in the art could appropriately add, delete or change the design of the constituent elements based on the display device of each embodiment, or add, omit or change conditions as long as it does not depart from the concept of the present invention and such changes are included within the scope of the present invention.

An EL display device is exemplified as a disclosure example in the present specification. The size of the display device can be applied from a medium to small size to a large size without any particular limitation.

Even if other actions and effects different from the actions and effects brought about by the aspects of each embodiment described above are obvious from the description of the present specification or those which could be easily predicted by those skilled in the art, such actions and effects are to be interpreted as being provided by the present invention.

What is claimed is:

1. A driving method for a display device, the display device comprising:
   a drive transistor having a first electrode connected to a first node, a second electrode connected to a second node, and a third electrode connected to a third node;
   a first switch having one terminal connected to the first node;
   a second switch having one terminal connected to the first node;
   a third switch controlled by a first control signal and having one terminal connected to the second node;
   a fourth switch controlled by the first control signal together with the third switch, and having one terminal connected to a power supply line and another terminal connected to the third node;
   a capacitor element having one terminal connected to the first node and another terminal connected to the second node; and
   a light emitting element including a pixel electrode connected to the second node, and a first common electrode;
   the driving method comprising steps of:
   applying a first voltage to the first node by setting the first switch to an OFF state and the second switch to an ON state;
   setting the fourth switch to an OFF state while applying the first voltage to the third node by setting the third switch to an ON state by the first control signal;
   setting the first switch and the second switch to an OFF state; and
   setting the fourth switch to an OFF state while applying a second voltage to the third node by setting the third switch to an ON state by the first control signal.

2. The driving method according to claim 1, wherein the light emitting element is non-light emitting and the display device displays black when setting the fourth switch to an OFF state while applying the second voltage to the third node by setting the third switch to an ON state by the first control signal.

3. The driving method according to claim 1, wherein the first voltage and the second voltage are substantially the same.

4. The driving method according to claim 1, wherein one of the first voltage and the second voltage is selected by a voltage selection circuit and applied to the third node.

* * * * *